(12) United States Patent
Yoshida

(10) Patent No.: US 11,282,866 B2
(45) Date of Patent: Mar. 22, 2022

(54) WIRING SUBSTRATE AND DISPLAY DEVICE

(71) Applicant: Sharp Kabushiki Kaisha, Osaka (JP)

(72) Inventor: Masahiro Yoshida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 75 days.

(21) Appl. No.: 16/839,170

(22) Filed: Apr. 3, 2020

(65) Prior Publication Data

US 2020/0321358 A1    Oct. 8, 2020

Related U.S. Application Data

(60) Provisional application No. 62/829,663, filed on Apr. 5, 2019.

(51) Int. Cl.
*H01L 27/12* (2006.01)
*H01L 27/32* (2006.01)

(52) U.S. Cl.
CPC ........ *H01L 27/124* (2013.01); *H01L 27/3276* (2013.01)

(58) Field of Classification Search
CPC .................. H01L 27/124; H01L 27/3276
See application file for complete search history.

(56) References Cited

U.S. PATENT DOCUMENTS

2010/0066709 A1*  3/2010  Yajima .................. H05K 1/117
                                                                  345/204

FOREIGN PATENT DOCUMENTS

JP        2010-072256 A     4/2010

* cited by examiner

*Primary Examiner* — Kyoung Lee
(74) *Attorney, Agent, or Firm* — Keating & Bennett, LLP

(57) ABSTRACT

A wiring substrate includes a signal supply unit, a plurality of wirings disposed in a wiring region in which an intermediate region is interposed between the wiring region and the signal supply units, and having different distances from the signal supply unit, and a plurality of coupling wirings disposed in the intermediate region, and coupled to the signal supply unit and the plurality of wirings, in which the plurality of coupling wirings includes a first coupling wiring coupled to a wiring having a short distance from the signal supply unit, and a second coupling wiring coupled to a wiring having a long distance from the signal supply unit among the plurality of wirings, and the first coupling wiring is folded back to the signal supply unit side in the middle of running from the signal supply unit to the wiring region.

20 Claims, 21 Drawing Sheets

WIRING SUBSTRATE AND DISPLAY DEVICE

TECHNICAL FIELD

The present disclosure relates to a wiring substrate and a display device.

BACKGROUND ART

In the related art, as an example of a lead wiring device, a device described in JP 2010-72256A below is known. The lead wiring device described in JP 2010-72256A includes an insulating layer that electrically insulates, a coupling portion penetrating the insulating layer, an external coupling terminal formed on one surface of the insulating layer, and a lead wire formed on the other surface of the insulating layer. The external coupling terminal and the lead wire are coupled to each other by the coupling portion. One end portion of the lead wire is coupled to a conductor. The other end portion of the lead wire is coupled to the external coupling terminal by the coupling portion at a position separated from a first end portion of the external coupling terminal on the conductor side by a predetermined distance.

SUMMARY OF INVENTION

In the lead wiring device described in JP 2010-72256A described above, one end portion of the lead wire is coupled to the external coupling terminal by the coupling portion at a position separated from the end portion of the external coupling terminal on the conductor side by a predetermined distance. Therefore, an adjustment range of a resistance value of the lead wire can be expanded. However, in the lead wiring device described in JP 2010-72256A, since the disposition of the coupling portion can be changed only within the range of the length of the external coupling terminal, it can not be said that the adjustment range of the resistance value of the lead wire is sufficiently expanded, and further improvement is desired.

The present disclosure is completed based on the above-described circumstances, and the adjustment range related to a wiring resistance of the coupling wiring is further expanded.

Solution to Problem (1) According to an aspect of the present disclosure, there is provided a wiring substrate including a signal supply unit, a plurality of wirings disposed in a wiring region in which an intermediate region is interposed between the wiring region and the signal supply unit, and having different distances from the signal supply unit, and a plurality of coupling wirings disposed in the intermediate region, and coupled to the signal supply unit and the plurality of wirings, in which the coupling wiring includes a first coupling wiring coupled to a wiring having a short distance from the signal supply unit, and a second coupling wiring coupled to a wiring having a long distance from the signal supply unit among the plurality of wirings, and the first coupling wiring is folded back to the signal supply unit side in the middle of running from the signal supply unit to the wiring region.

(2) In the wiring substrate according to the aspect of the present disclosure, in addition to the configuration of the above (1), the first coupling wiring includes a signal supply unit coupling portion coupled to the signal supply unit and extending toward the wiring region side, a wiring coupling portion coupled to the wiring and extending toward the signal supply unit side, and an intermediate portion coupled to each of an extension end-side portion of the signal supply unit coupling portion and an extension end-side portion of the wiring coupling portion.

(3) In the wiring substrate according to the aspect of the present disclosure, in addition to the configuration of the above (2), in the first coupling wiring, the signal supply unit coupling portion, the wiring coupling portion, and the intermediate portion are formed of a plurality of conductive films with an insulating film interposed therebetween, and the signal supply unit coupling portion, the wiring coupling portion, and the intermediate portion include portions that at least partially overlap each other through the insulating film.

(4) In the wiring substrate according to the aspect of the present disclosure, in addition to the configuration of the above (3), the signal supply unit coupling portion, the wiring coupling portion, and the intermediate portion are formed of the conductive films different from each other, and the signal supply unit coupling portion and the wiring coupling portion are disposed so as not to overlap each other, and the intermediate portion is disposed so as to partially overlap the signal supply unit coupling portion and the wiring coupling portion, respectively.

(5) In the wiring substrate according to the aspect of the present disclosure, in addition to the configuration of the above (3) or (4), the signal supply unit coupling portion, the wiring coupling portion, and the intermediate portion are formed of the conductive films different from each other, and the intermediate portion is formed of the conductive film located at an intermediate position between both the conductive film constituting the signal supply unit coupling portion and the conductive film constituting the wiring coupling portion through insulating films, respectively, and is coupled to the signal supply unit coupling portion and the wiring coupling portion through contact holes formed to open in each of the insulating films.

(6) In the wiring substrate according to the aspect of the present disclosure, in addition to the configuration of any one of the above (2) to (5), the first coupling wiring is configured such that the extension end-side portion of the signal supply unit coupling portion is disposed closer to the wiring region than the extension end-side portion of the wiring coupling portion.

(7) In the wiring substrate according to the aspect of the present disclosure, in addition to the configuration of the above (6), the first coupling wiring is configured such that the extension end-side portion of the signal supply unit coupling portion is disposed at a position adjacent to the wiring region, and the extension end-side portion of the wiring coupling portion is disposed at a position adjacent to the signal supply unit.

(8) In the wiring substrate according to the aspect of the present disclosure, in addition to the configuration of the above (6) or (7), in the first coupling wiring, the signal supply unit coupling portion, the wiring coupling portion, and the intermediate portion are formed of a plurality of conductive films with an insulating film interposed therebetween, and the signal supply unit coupling portion, the wiring coupling portion, and the intermediate portion each have parallel portions parallel to each other, and the parallel portions include portions that at least partially overlap each other through the insulating film.

(9) In the wiring substrate according to the aspect of the present disclosure, in addition to the configuration of any one of the above (1) to (8), the second coupling wiring has a plurality of second coupling wiring constituting portions formed of a plurality of conductive films having an insulating film interposed therebetween, and coupled to each other.

(10) In the wiring substrate according to the aspect of the present disclosure, in addition to the configuration of the above (9), the plurality of second coupling wiring constituting portions include portions that at least partially overlap each other through the insulating film.

(11) In the wiring substrate according to the aspect of the present disclosure, in addition to the configuration of the above (10), the second coupling wiring includes three or more second coupling wiring constituting portions, and the three or more second coupling wiring constituting portions are disposed in parallel with each other and to overlap each other through the insulating film.

(12) In the wiring substrate according to the aspect of the present disclosure, in addition to the configuration of any one of the above (1) to (11), the wiring substrate further including a plurality of second wirings disposed in the wiring region and extending so as to intersect the wiring, in which the plurality of wirings are disposed such that an arrangement interval thereof is larger than an arrangement interval of the plurality of second wirings.

(13) In the wiring substrate according to the aspect of the present disclosure, in addition to the configuration of any one of the above (1) to (12), the first coupling wiring is folded back while meandering in a zigzag shape.

(14) According to an aspect of the present disclosure, there is provided a display device including the wiring substrate according to any one of (1) to (13), and a plurality of pixel units disposed in the wiring region and coupled to the plurality of wirings.

According to this disclosure, the adjustment range related to a wiring resistance of the coupling wiring can be further expanded.

DESCRIPTION OF EMBODIMENTS

Embodiment 1

Embodiment 1 of the present disclosure will be described with reference to FIGS. 1 to 15. In the present embodiment, an array substrate 21 constituting a liquid crystal panel (display panel) 11 will be described as an example. An X axis, a Y axis, and a Z axis are illustrated in a portion of each drawing, and each axis direction is drawn so as to be the direction illustrated in each drawing. An upper side of FIGS. 3 to 6, 9 to 12, 14, and 15 is defined as a front side, and a lower side is defined as a rear side.

Figure 1:
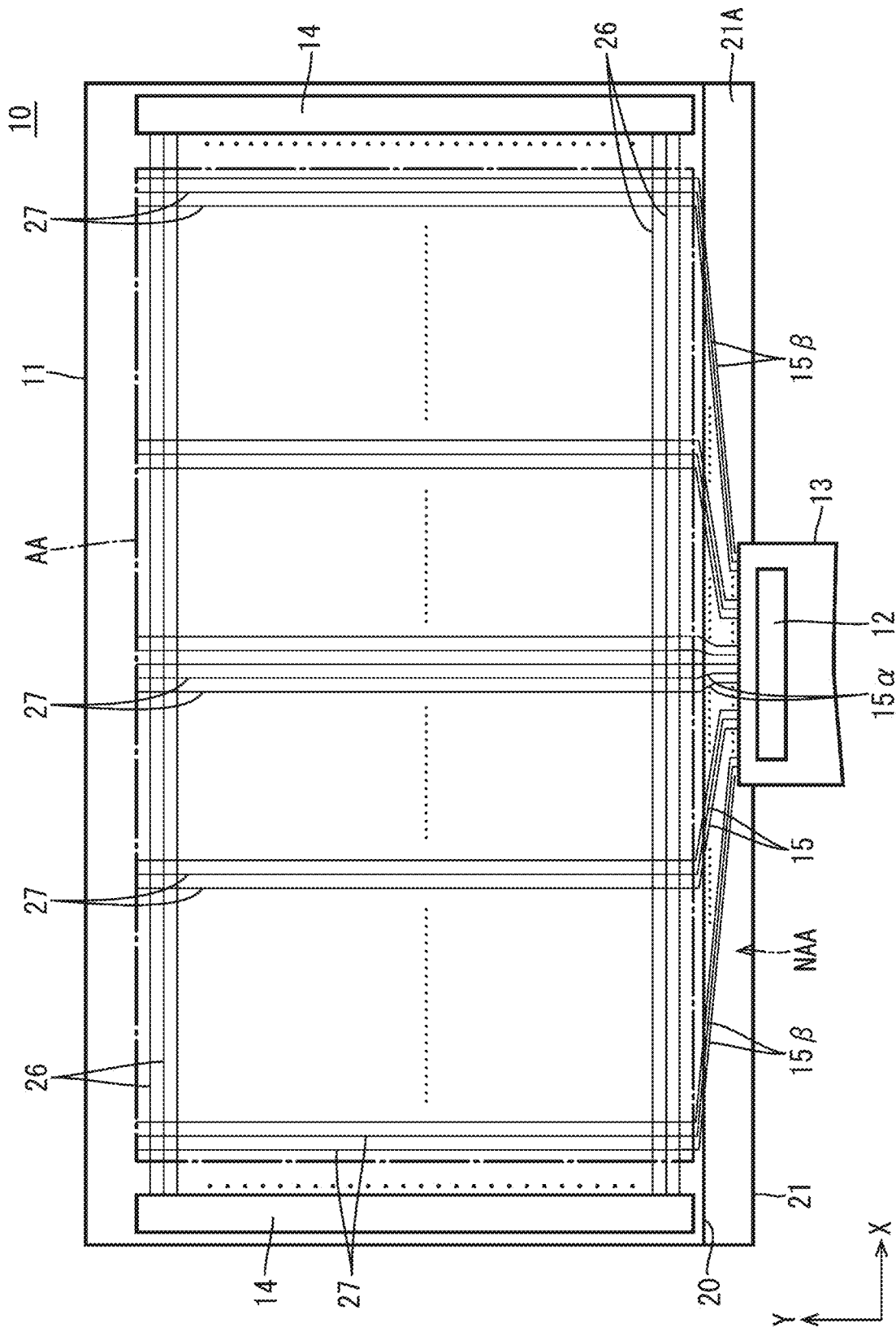
FIG. 1 is a schematic plan view of a liquid crystal panel provided in a liquid crystal display device according to Embodiment 1 of the present disclosure.

FIG. 1 is a schematic plan view of the liquid crystal panel 11. As illustrated in FIG. 1, the liquid crystal display device 10 is provided with at least the liquid crystal panel (display device, display panel) 11 having an elongated rectangular shape and capable of displaying an image and a backlight device (lighting device) serving as an external light source, which irradiates the liquid crystal panel 11 with light used for display. In the present embodiment, a screen size of the liquid crystal panel 11 is approximately 30 inches (specifically, 31.5 inches), for example, and the resolution is equivalent to "WXGA". The backlight device is disposed on the rear side (rear surface side) with respect to the liquid crystal panel 11, and includes a light source (for example, LED or the like) that emits white light or an optical member converting light from the light source into planar light by applying an optical action to the light.

As illustrated in FIG. 1, in the liquid crystal panel 11, a center-side portion of the screen is a display region (wiring region) AA where an image is displayed. The display region AA is a range surrounded by a chain line in FIG. 1. On the other hand, a frame-shaped outer peripheral portion surrounding the display region AA on the screen of the liquid crystal panel 11 is a non-display region NAA in which no image is displayed. In the present embodiment, the long side dimension in the display region AA is, for example, 697.7 mm, and the short side dimension is, for example, 392.3 mm. The liquid crystal panel 11 is formed by bonding a pair of substrates 20 and 21. A front side (front surface side) among the pair of substrates 20 and 21 is a CF substrate (counter substrate) 20, and a rear side (rear surface side) is an array substrate (wiring substrate, active matrix substrate)

21. Each of the CF substrate 20 and the array substrate 21 is formed by laminating various films on the inner surface side of a glass substrate. Polarizing plates are attached to the outer surfaces of the substrates 20 and 21, respectively.

As illustrated in FIG. 1, the CF substrate 20 is bonded to the array substrate 21 such that one end portion thereof is aligned with the short side direction (Y axis direction) while the short side dimension is shorter than the short side dimension of the array substrate 21. Therefore, the other end portion of the array substrate 21 in the short side direction is a non-overlapping portion 21A of the CF substrate, which projects laterally from the CF substrate 20 and does not overlap the CF substrate 20. A flexible substrate 13 having a driver 12 is mounted on the non-overlapping portion 21A of the CF substrate by chip on board (COB). The driver 12 is formed of an LSI chip having a drive circuit therein, is mounted on the flexible substrate 13 by chip on film (COF), and processes various signals supplied through the flexible substrate 13. In the present embodiment, only one driver 12 is mounted on the flexible substrate 13. The flexible substrate 13 has a configuration in which a large number of wiring patterns are formed on a substrate formed of a synthetic resin material having insulating properties and flexibility (for example, polyimide resin). The flexible substrate 13 has one end coupled to the non-display region NAA of the liquid crystal panel 11 and the other end coupled to a control substrate (signal supply source). Various signals supplied from the control substrate are transmitted to the driver 12 through the flexible substrate 13, processed there, and thereafter supplied to the liquid crystal panel 11 through the flexible substrate 13. In the present embodiment, only one flexible substrate 13 is mounted at a substantially central position in the long side direction (X axis direction) in the non-overlapping portion 21A of the CF substrate on the array substrate 21. In the non-overlapping portion 21A of the CF substrate on the array substrate 21, a plurality of coupling wirings (leading wiring) 15 are provided to be routed in an extended fan shape from a mounting region of the flexible substrate 13 to the display region AA. The coupling wiring 15 will be described later. In the non-display region NAA of the array substrate 21, a pair of gate circuit units (signal supply units) 14 are provided so as to interpose the display region AA from both sides in the X axis direction. The gate circuit unit 14 is a unit for supplying a scanning signal to a gate wiring 26 described later, and is provided monolithically on the array substrate 21.

Figure 2:
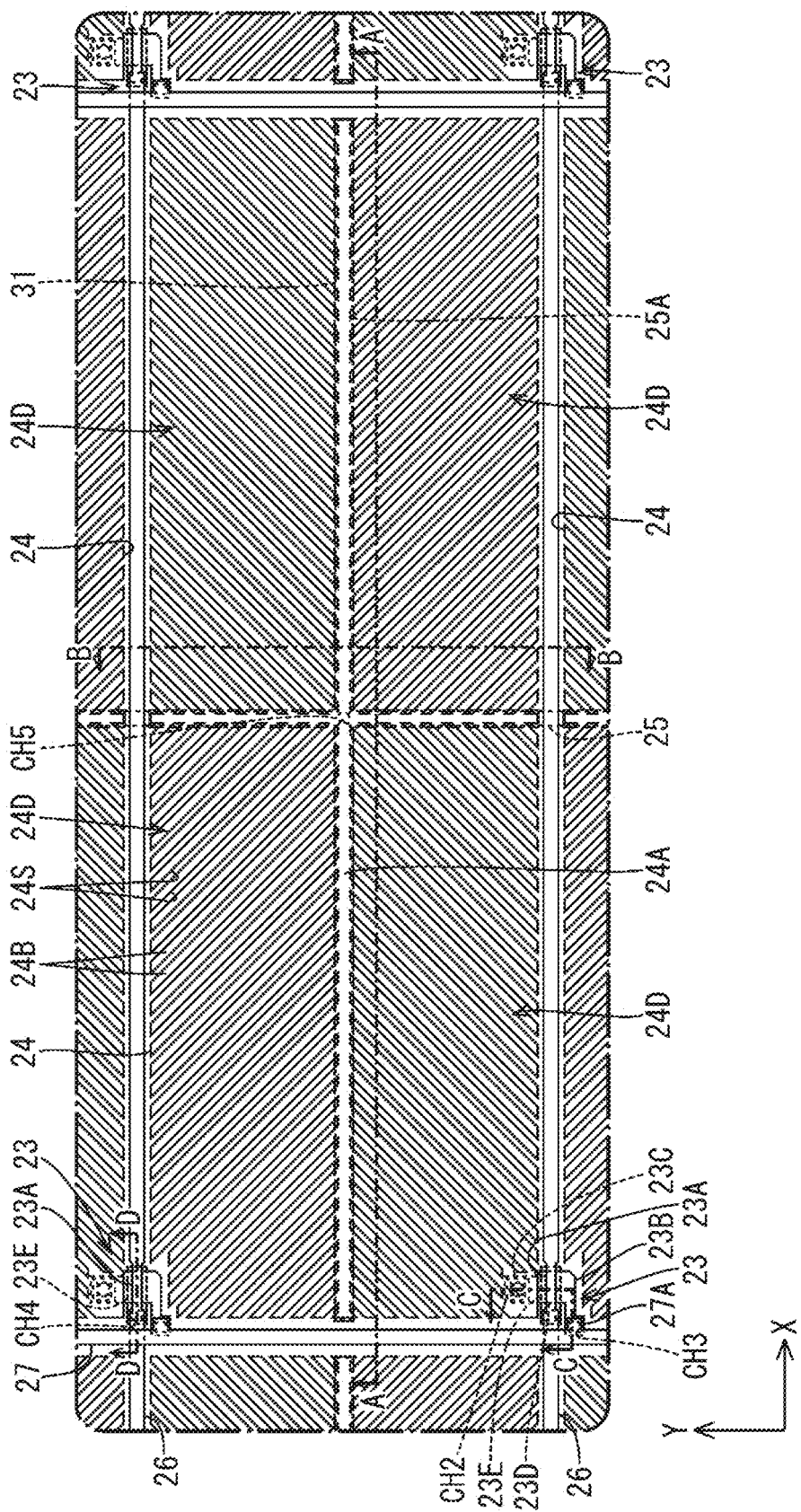
FIG. 2 is a plan view illustrating a pixel array on an array substrate constituting the liquid crystal panel.

FIG. 2 is a plan view of the array substrate 21 and the CF substrate 20 constituting the liquid crystal panel 11 in the display region AA. As illustrated in FIG. 2, a thin film transistor (switching element, TFT) 23 and a pixel electrode 24 are provided on the inner surface side of the display region AA on the array substrate 21. The TFTs 23 and the pixel electrodes 24 are arranged in a matrix (in rows and columns) at intervals along the X axis direction and the Y axis direction. Around the TFT 23 and the pixel electrode 24, a gate wiring (second wiring, scanning wiring) 26 and a source wiring (wiring, image wiring, data wiring) 27, which form a substantially lattice shape, are provided so as to surround these. The gate wiring 26 extends along the X axis direction, while the source wiring 27 extends along the Y axis direction. In the present embodiment, the resolution of the liquid crystal panel 11 is equivalent to "WXGA", and as described later, the three color filters 28 have a configuration in which those exhibiting different colors from each other are repeatedly disposed along the source wiring 27 (Y axis direction). Therefore, the number of the gate wirings 26 is "768×3=2304", and the number of source wirings 27 is "1366". The gate wiring 26 and the source wiring 27 are coupled to an upper layer-side gate electrode 23A and a lower layer-side gate electrode 23E of the TFT 23 and a source region 23B, respectively, and the pixel electrode 24 is coupled to a drain region 23C of the TFT 23. The TFT 23 is driven based on various signals supplied to the gate wiring 26 and the source wiring 27, respectively, and controls the supply of a potential to the pixel electrode 24 with the driving. The TFT 23 is disposed adjacent to the pixel electrode 24 to be coupled on one side (left side in FIG. 2) in the X axis direction.

As illustrated in FIG. 2, the pixel electrode 24 has an elongated long shape in a plan view, and a longitudinal direction coincides with the X axis direction, and a short direction coincides with the Y axis direction. The ratio of a longitudinal dimension to a short dimension in the pixel electrode 24 is 3. While the gate wiring 26 is interposed between the pixel electrodes 24 adjacent in the short direction (Y axis direction), the source wiring 27 is interposed between the pixel electrodes 24 adjacent in the longitudinal direction (X axis direction). The arrangement interval of the gate wiring 26 is approximately the same as the short dimension of the pixel electrode 24, and the arrangement interval of the source wiring 27 is approximately the same as the longitudinal dimension of the pixel electrode 24 and is larger than the arrangement interval of the gate wiring 26. Therefore, as compared with the case where the pixel electrode has a vertically elongated shape, the arrangement interval of the source wiring 27 is approximately the ratio obtained by dividing the short dimension of the pixel electrode 24 by the longitudinal dimension (for example, approximately ⅓). Accordingly, the number of source wirings 27 per unit length in the X axis direction is approximately the same ratio as described above (for example, approximately ⅓). As compared with the case where the pixel electrode has a vertically elongated shape, the arrangement interval of the gate wiring 26 is approximately the ratio obtained by dividing the longitudinal dimension of the pixel electrode 24 by the short dimension (for example, approximately 3). Accordingly, the number of gate wirings 26 per unit length in the X axis direction is approximately the same ratio as described above (for example, approximately 3). As a result, the number of the source wirings 27 can be reduced, so that the number of image signals supplied to the source wiring 27 is reduced.

As illustrated in FIG. 2, the pixel electrode 24 having an elongated rectangular shape as described above includes a stem electrode unit 24A and a plurality of branch electrode units 24B coupled to the stem electrode unit 24A, and has a fishbone shape as a whole in a plan view. The stem electrode unit 24A has a cross shape in a plan view, and includes a portion extending along the X axis direction and a portion extending along the Y axis direction. The plurality of the branch electrode units 24B are disposed in each of four regions partitioned by the cross-shaped stem electrode unit 24A, has one end coupled to the stem electrode unit 24A, and extends in such a manner as to extend substantially radially from the center of the stem electrode unit 24A. Therefore, the plurality of branch electrode units 24B disposed in four regions adjacent to each other in the X axis direction and the Y axis direction have a relationship in which the extending directions intersect each other. The plurality of branch electrode units 24B are disposed side by side at substantially equal intervals in the above-described four regions, and slits 24S having a substantially constant width are provided between adjacent branch electrode units 24B. The extending direction of the slit 24S coincides with the extending direction of the branch electrode unit 24B, and extends in such a manner that the slit 24S substantially radially extends from the center of the stem electrode unit 24A in each of the four regions described above. As described above, it can be said that the pixel electrode 24 is divided into four domains 24D in which the extending directions of the slits 24S are different from each other, and each domain 24D is disposed in the pixel electrode 24 two by two in the X axis direction and the Y axis direction. It can be said that the stem electrode unit 24A in the pixel electrode 24 is a boundary portion between the four domains 24D. Each of these four domains 24D has an elongated rectangular shape in a plan view. Here, since a partial recessed portion (portion where the pixel electrode 24 is absent) is formed in a portion of the front surface of the array substrate 21 that overlaps the slit 24S described above, and an electric field corresponding to the shape of the recessed portion is formed. Therefore, liquid crystal molecules contained in a liquid crystal layer 22 described later are aligned along the recessed portion. Therefore, the liquid crystal panel 11 according to the present embodiment is in a multi-domain vertical alignment (MVA) mode in which the alignment of the liquid crystal molecules included in the liquid crystal layer 22 differs for each domain 24D of the pixel electrode 24, so that the wide viewing angle is achieved.

As illustrated in FIG. 2, the TFT 23 includes an upper layer-side gate electrode (first gate electrode) 23A formed of a portion of the gate wiring 26. The upper layer-side gate electrode 23A is formed of a portion of the gate wiring 26 that intersects a channel region 23D. A scanning signal transmitted to the gate wiring 26 is supplied to the upper layer-side gate electrode 23A. The TFT 23 includes a source region 23B coupled to the source wiring 27. The source wiring 27 includes a source wiring widened portion 27A protruding toward the pixel electrode 24 to be coupled in the X axis direction (right side in FIG. 2) from a position opposite to the pixel electrode 24 to be coupled in the Y axis direction (lower side in FIG. 2) with respect to the intersection portion with the gate wiring 26. The source region 23B has a substantially L-shape in a plan view, and a portion extending along the X axis direction is coupled to the above-described source wiring widened portion 27A. The TFT 23 includes the drain region 23C which is disposed at an interval from the source region 23B in the Y axis direction. An end portion of the drain region 23C opposite to the source region 23B (channel region 23D) is coupled to the pixel electrode 24. The TFT 23 is disposed to overlap the upper layer-side gate electrode 23A on the upper layer side, and has the channel region 23D coupled to the source region 23B and the drain region 23C. Similarly to the upper layer-side gate electrode 23A, the channel region 23D has an elongated rectangular shape in a plan view, one end portion in the Y axis direction (lower end portion in FIG. 2) is coupled to a portion of the source region 23B extending along the Y axis direction, and the other end portion (upper end portion in FIG. 2) is coupled to the drain region 23C, respectively. Furthermore, the TFT 23 includes a lower layer-side gate electrode (second gate electrode) 23E disposed so as to overlap the channel region 23D on the upper layer side. The lower layer-side gate electrode 23E has an elongated rectangular shape in a plan view, similar to the upper layer-side gate electrode 23A and the channel region 23D. Since the lower layer-side gate electrode 23E is electrically coupled to the upper layer-side gate electrode 23A, the scanning signal transmitted to the gate wiring 26 is supplied at the same timing as the upper layer-side gate electrode 23A. As described above, the channel region 23D is interposed between the upper layer side and the lower layer side in the Z axis direction by the upper layer-side gate electrode 23A and the lower layer-side gate electrode 23E. Therefore, the drain current flowing through the channel region 23D can be increased as compared with the case where only one gate electrodes is disposed to overlap the channel region 23D. As a result, the pixel electrode 24 can be sufficiently charged even when the charging time of the pixel electrode 24 charged by the TFT 23 is shortened as the number of the gate wirings 26 is increased.

Figure 3:
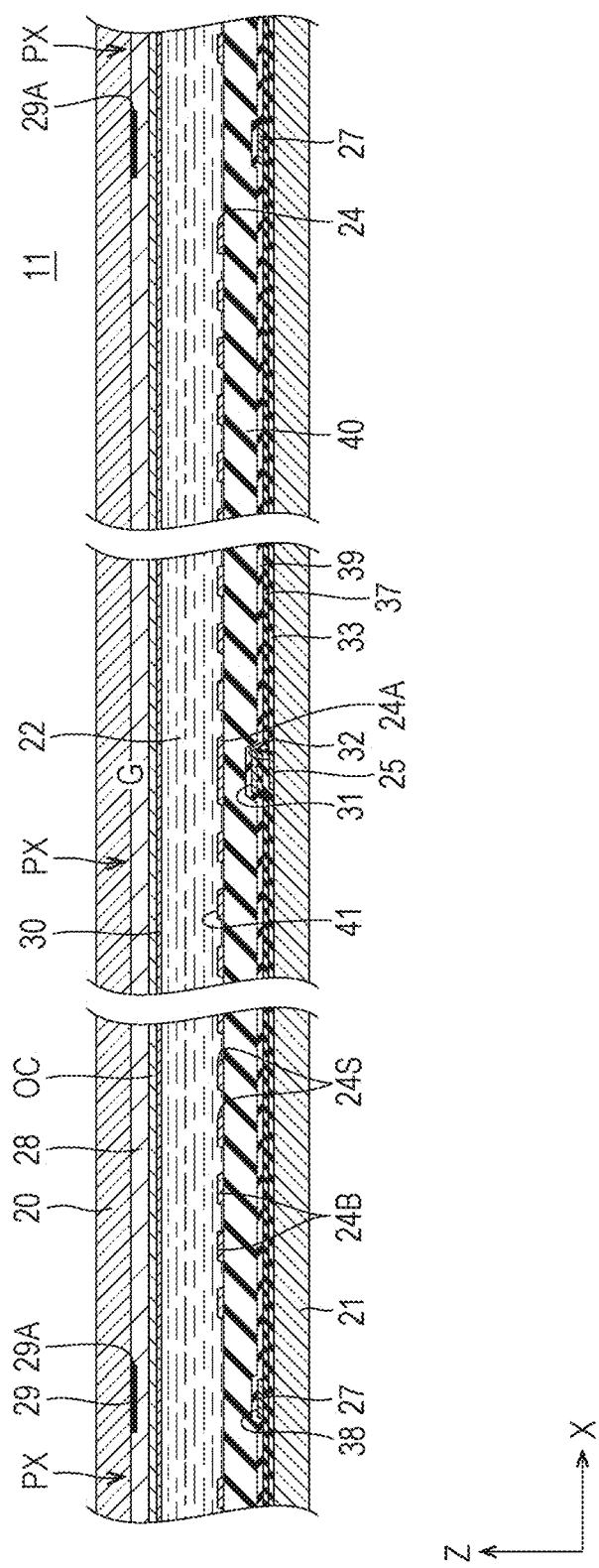
FIG. 3 is a cross-sectional view of the liquid crystal panel taken along line A-A of FIG. 2.
Figure 4:
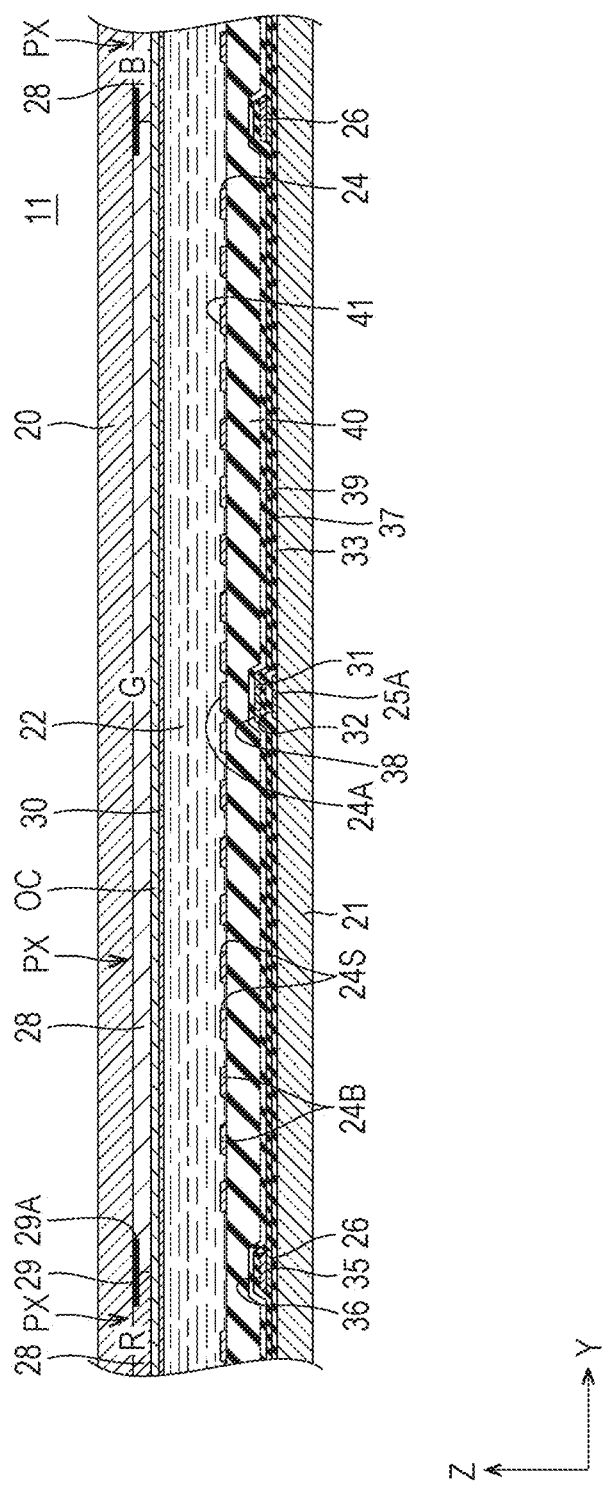
FIG. 4 is a cross-sectional view of the liquid crystal panel taken along line B-B of FIG. 2.

FIG. 3 is a cross-sectional view of the pixel unit PX of the liquid crystal panel 11 cut along the X axis direction. FIG. 4 is a cross-sectional view of the pixel unit PX of the liquid crystal panel 11 cut along the Y axis direction. As illustrated in FIGS. 3 and 4, the liquid crystal panel 11 has a liquid crystal layer 22 that is disposed between the pair of substrates 20 and 21, and that includes liquid crystal molecules, which are substances whose optical performance changes with the application of an electric field. In the display region AA on the inner surface side of the CF substrate 20 constituting the liquid crystal panel 11, three color filters 28 of blue (B), green (G), and red (R) are provided. A plurality of color filters 28 are arranged in a matrix in the X axis direction and the Y axis direction so as to overlap the pixel electrodes 24 on the array substrate 21 side in a plan view. In the color filters 28, those exhibiting different colors from each other are repeatedly disposed along the source wiring 27 (Y axis direction), and those exhibiting the same color are continuously disposed along the gate wiring 26 (X axis direction). In the liquid crystal panel 11, the R, G, and B color filters 28 disposed along the Y axis direction, and the three pixel electrodes 24 facing each color filter 28 form a pixel unit PX of three colors. In the liquid crystal panel 11, display pixels capable of performing color display with a predetermined gradation are formed by the R, G, and B three color pixel units PX adjacent to each other along the Y axis direction. The arrangement pitch in the X axis direction in the pixel unit PX is, for example, approximately 510 µm (more specifically, for example, 510.75 µm), and the arrangement pitch in the Y axis direction is, for example, approximately 170 µm (more specifically, for example, 170.25 µm).

In the display region AA on the inner surface side of the CF substrate 20, as illustrated in FIGS. 3 and 4, a black matrix (light shielding unit between pixels) disposed so as to partition between the color filters 28 facing the adjacent pixel electrodes 24. 29 is formed. The black matrix 29 has a substantially lattice-like planar shape, and has a pixel opening portion 29A at a position where the black matrix 29 overlaps most of the pixel electrodes 24 in a plan view. The light transmitted through the pixel electrode 24 can be emitted to the outside of the liquid crystal panel 11 by the pixel opening portion 29A. The black matrix 29 is disposed to overlap at least the TFT 23, the gate wiring 26, and the source wiring 27 on the array substrate 21 side in a plan view. On the inner surface side of the color filter 28, a counter electrode 30 is provided. The counter electrode 30 is provided in a solid shape at least in the display region AA, and faces all the pixel electrodes 24 with the liquid crystal layer 22 interposed therebetween. By supplying a reference potential (common potential) to the counter electrode 30, a potential difference is generated between the counter electrode 30 and the pixel electrode 24 charged by the TFT 23. The alignment state of the liquid crystal molecules in the liquid crystal layer 22 changes based on this potential difference, so that a predetermined gradation display can be performed for each pixel. An overcoat film OC for flattening the innermost surface of the CF substrate 20 is provided between the color filter 28 and the counter electrode 30. It is preferable to provide a space for maintaining the thickness (cell gap) of the liquid crystal layer 22 on the inner surface side of the counter electrode 30. Alignment films for aligning liquid crystal molecules included in the liquid crystal layer 22 are provided on the innermost surfaces of the substrates 20 and 21 that are in contact with the liquid crystal layer 22. In the present embodiment, a vertical alignment film is used as the alignment film.

In the display region AA on the inner surface side of the array substrate 21, a capacitance wiring 25 is provided as illustrated in FIGS. 2 to 4. The capacitance wiring 25 is disposed at a substantially intermediate position between two adjacent source wiring 27 in the X axis direction, and extends along the Y axis direction in parallel with the source wiring 27. The same reference potential as that of the counter electrode 30 is supplied to the capacitance wiring 25 by the flexible substrate 13 (refer to FIG. 1) described above. The capacitance wiring 25 collectively crosses a plurality of pixel electrodes 24 (pixel electrode rows) disposed along the Y axis direction, and are respectively disposed to be overlapped on a substantially central portion of each of the pixel electrodes 24 in the long side direction (X axis direction). Moreover, a capacitance forming unit 31 which is disposed to overlap the pixel electrode 24 and is coupled to the capacitance wiring 25 is provided in the display region AA on the inner surface side of the array substrate 21. The capacitance forming unit 31 can be maintained at the reference potential by the capacitance wiring 25 and form an electrostatic capacitance between the pixel electrodes 24 to be overlapped, so that the charged potential of the pixel electrode 24 can be maintained. The capacitance forming unit 31 includes a portion extending along the Y axis direction and overlaps a substantially central portion in the long side direction of the pixel electrode 24, and a portion extending along the X axis direction and overlaps a substantially central portion in the short side direction (Y axis direction) of the pixel electrode 24. That is, the capacitance forming unit 31 has a cross shape in a plan view, and is disposed so that substantially the entire area thereof overlaps the stem electrode unit 24A of the pixel electrode 24. Therefore, the capacitance forming unit 31 is disposed so as to be selectively overlapped with the boundary portion between the domains 24D adjacent to each other in the X axis direction and the Y axis direction in the pixel electrode 24. Here, in the vicinity of the boundary portion between the plurality of domains 24D in the pixel electrode 24, since it is difficult for the liquid crystal molecules to be aligned in a desired direction, for example, in a direction along the slit 24S where the pixel electrode 24 is absent, the amount of transmitted light tends to be locally reduced. On the other hand, as described above, when the capacitance forming unit 31 is disposed to selectively overlap the boundary portion between the adjacent domains 24D of the pixel electrode 24, a decrease in the amount of transmitted light which may occur due to the capacitance forming unit 31 being disposed to overlap the pixel electrode 24 is suppressed. Therefore, the aperture ratio can be improved as compared with the case where the capacitance forming unit is disposed not to be overlapped with the stem electrode unit 24A and to be overlapped with the domain 24D. The capacitance wiring 25 is provided with a branch unit 25A that overlaps a portion of the capacitance forming unit 31 extending along the X axis direction.

Figure 5:
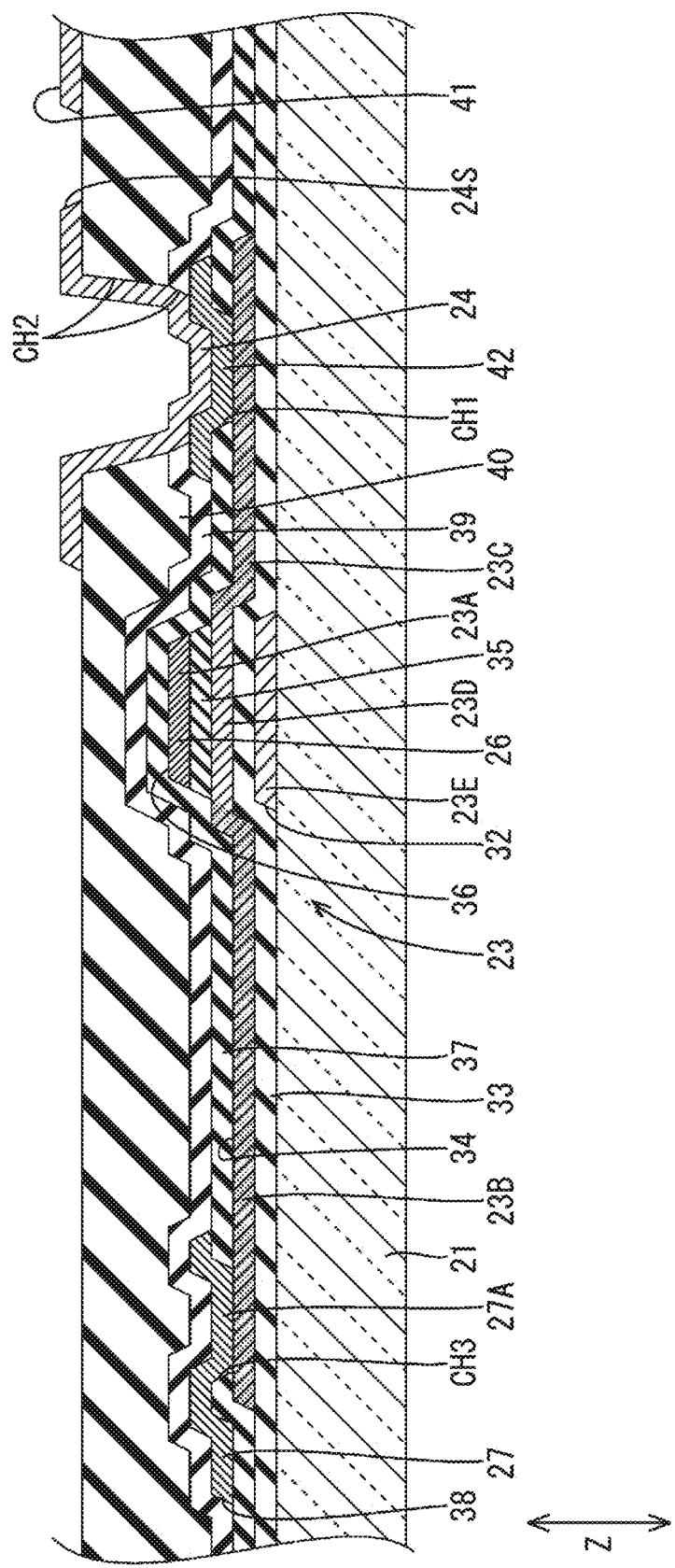
FIG. 5 is a cross-sectional view of the array substrate taken along line C-C of FIG. 2.
Figure 6:
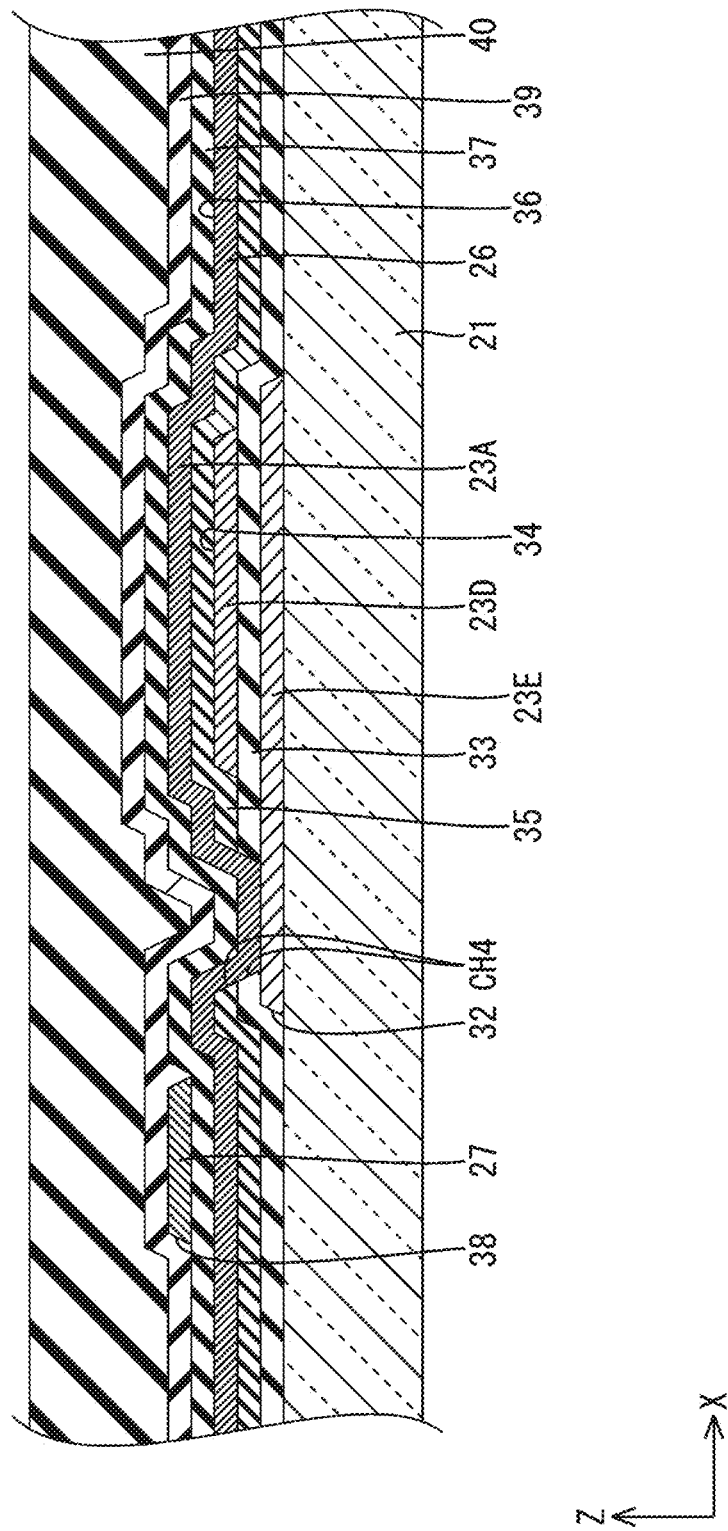
FIG. 6 is a cross-sectional view of the array substrate taken along line D-D of FIG. 2.

Here, various films laminated on the inner surface side of the array substrate 21 will be described with reference to FIGS. 5 and 6. FIGS. 5 and 6 are cross-sectional views of the vicinity of the TFT 23 on the array substrate 21, respectively. As illustrated in FIGS. 5 and 6, on the array substrate 21, a first metal film (conductive film) 32, a lower layer-side gate insulating film (second gate insulating film) 33, a semiconductor film 34, an upper layer-side gate insulating film (first gate insulating film) 35, a second metal film (conductive film) 36, a first interlayer insulating film (insulating film) 37, a third metal film (conductive film) 38, a second interlayer insulating film (insulating film) 39, a flattening film (insulating film) 40, and a transparent electrode film 41 are sequentially laminated from a lower layer side (glass substrate side).

Each of the first metal film 32, the second metal film 36, and the third metal film 38 is formed of a single layer film formed of one type of metal material or laminated films or alloys formed of different types of metal materials, and thus has conductivity and light shielding property. As illustrated in FIGS. 5 and 6, the first metal film 32 forms the lower layer-side gate electrode 23E of the TFT 23, the capacitance wiring 25, and the like. The second metal film 36 forms the gate wiring 26, the upper layer-side gate electrode 23A of the TFT 23, and the like. The third metal film 38 forms a pixel intermediate electrode 42 coupled to both the drain region 23C and the pixel electrode 24, as illustrated in FIG. 5, in addition to form the source wiring 27 and the capacitance forming unit 31. Since the pixel electrode 24 is coupled to the drain region 23C through the pixel intermediate electrode 42, as compared with a case where the pixel electrode is directly coupled to the drain region 23C, a problem such as a film break in the pixel electrode 24 is unlikely to occur, and the coupling reliability is high. The transparent electrode film 41 is formed of a transparent electrode material (for example, Indium Tin Oxide (ITO) or Indium Zinc Oxide (IZO)). The transparent electrode film 41 forms the pixel electrode 24 and the like. As illustrated in FIGS. 3 and 4, the capacitance forming unit 31 is configured to include the third metal film 38 disposed above the first metal film 32 and the second metal film 36, that is, close to the transparent electrode film 41. Therefore, a large electrostatic capacitance can be formed between the pixel electrodes 24 and the capacitance forming unit 31. As a result, the function of holding the potential of the pixel electrode 24 is enhanced.

The semiconductor film 34 is an oxide semiconductor film using, for example, an oxide semiconductor as a material, and has a transparent property. The semiconductor film 34 forms the source region 23B, the drain region 23C, the channel region 23D, and the like, which form the TFT 23. Examples of a specific material of the semiconductor film 34 include an In—Ga—Zn—O-based semiconductor (for example, indium gallium zinc oxide). Here, the In—Ga—Zn—O-based semiconductor is a ternary oxide of indium (In), gallium (Ga), and zinc (Zn), and a ratio (composition ratio) of In, Ga, and Zn is not particularly limited. The ratio includes, for example, In:Ga:Zn=2:2:1, In:Ga:Zn=1:1:1, In:Ga:Zn=1:1:2, and the like, and is not necessarily limited thereto. The In—Ga—Zn—O-based semiconductor may be amorphous or crystalline. In the case of a crystalline semiconductor, the semiconductor is preferably a crystalline In—Ga—Zn—O-based semiconductor in which the c axis is aligned substantially perpendicular to the layer surface. Here, a portion of the semiconductor film 34 (portion that does not overlap the second metal film 36) is reduced in resistance during the manufacturing process, and the semiconductor film 34 is configured to include a low resistance region and a non-resistance region. Specifically, after the semiconductor film 34 is patterned to have a predetermined planar shape, a low resistance treatment is performed using the upper layer-side gate insulating film 35 and the second metal film 36 laminated and formed on the upper layer side as a mask. A portion of the semiconductor film 34 that is exposed without being covered by the second metal film 36 (portion that does not overlap the second metal film 36) is the low resistance region, and a portion covered by the second metal film 36 (portion overlapping with the second metal film 36) is the non-resistance-lowering region. In FIG. 5, the low resistance region in the semiconductor film 34 is illustrated in a hatched shape. The low resistance region of the semiconductor film 34 has a significantly low resistivity, for example, approximately ¹⁄₁₀,₀₀₀,₀₀₀,₀₀₀ to ¹⁄₁₀₀, as compared with the non-resistance-lowering region, and functions as a conductor. The source region 23B and the drain region 23C of the TFT 23 are configured to include the low resistance region of the semiconductor film 34. In the non-resistance-lowering region on the semiconductor film 34, electric charge can be moved only under specific conditions (when a scanning signal is supplied to each of the gate electrodes 23A and 23E), and in the low resistance region, electric charge can normally be moved and functions as a conductor. The non-resistance-lowering region of the semiconductor film 34 forms the channel region 23D of the TFT 23. On the lower layer side with respect to the channel region 23D, the lower layer-side gate electrode 23E formed of the first metal film 32 having a light shielding property in the TFT 23 is disposed to overlap. The lower layer-side gate electrode 23E can block light irradiated from the rear side to the channel region 23D. For example, such light is light for display irradiated from the backlight device to the liquid crystal panel 11 or the like. Since the above-described light toward the channel region 23D is blocked by the lower layer-side gate electrode 23E, a change in the performance of the TFT 23 that may occur when the light is irradiated to the channel region 23D can be suppressed.

The lower layer-side gate insulating film 33, the upper layer-side gate insulating film 35, the first interlayer insulating film 37, and the second interlayer insulating film 39 are each formed of an inorganic material such as silicon nitride (SiNx) and silicon oxide (SiO2). The flattening film 40 is formed of, for example, an organic material such as PMMA (acrylic resin), and has a larger film thickness than these of the other insulating films 33, 35, 37, and 38 formed of an inorganic material. The innermost surface of the array substrate 21 is flattened by the flattening film 40. As illustrated in FIGS. 5 and 6, the lower layer-side gate insulating film 33 maintains the first metal film 32 on the lower layer side and the semiconductor film 34 on the upper layer side in an insulated state. In particular, the interval between the upper layer-side gate electrode 23A and the channel region 23D is kept constant by the portion of the lower layer-side gate insulating film 33 that overlaps the upper layer-side gate electrode 23A. The upper layer-side gate insulating film 35 maintains the semiconductor film 34 on the lower layer side and the second metal film 36 on the upper layer side in an insulated state. In particular, the interval between the lower layer-side gate electrode 23E and the channel region 23D is kept constant by the portion of the upper layer-side gate insulating film 35 that overlaps the lower layer-side gate electrode 23E. The upper layer-side gate insulating film 35 is patterned together with the second metal film 36 disposed on the upper layer side, and has a formation range that overlaps a substantially entire area of the second metal film 36 (excluding gate contact hole CH4 described later). The first interlayer insulating film 37 maintains the second metal film 36 on the lower side and the third metal film 38 on the upper side in an insulated state. The second interlayer insulating film 39 and the flattening film 40 maintain the third metal film 38 on the lower side and the transparent electrode film 41 on the upper side in an insulated state.

As illustrated in FIG. 5, a first pixel contact hole CH1 for coupling the pixel intermediate electrode 42 to the drain region 23C is formed to open at a position that overlaps both the drain region 23C and the pixel intermediate electrode 42 in the first interlayer insulating film 37. Second pixel contact holes CH2 for coupling the pixel electrode 24 to the pixel intermediate electrode 42 are respectively formed to open at positions that overlap both the pixel electrode 24 and the pixel intermediate electrode 42 among the second interlayer insulating film 39 and the flattening film 40. The drain region 23C and the pixel electrode 24 are coupled to the pixel intermediate electrode 42 through these each pixel contact hole CH1 and CH2, respectively. Since the pixel intermediate electrode 42 is disposed so as to cover a portion facing the first pixel contact hole CH1 of the drain region 23C formed of the semiconductor film 34 from the upper layer side, when the second interlayer insulating film 39 is etched through the patterned flattening film 40, the drain region 23C can be prevented from being over-etched. A source contact hole CH3 for coupling the source wiring widened portion 27A to the source region 23B is formed to open at a position in the first interlayer insulating film 37 that overlaps both the source wiring widened portion 27A and the source region 23B of the source wiring 27. As illustrated in FIG. 6, gate contact holes CH4 for coupling the upper layer-side gate electrode 23A to the lower layer-side gate electrode 23E are formed to open at positions that overlap both the upper layer-side gate electrode 23A and the lower layer-side gate electrode 23E and do not overlap the channel region 23D among the lower layer-side gate insulating film 33 and the upper layer-side gate insulating film 35. A capacitance wiring contact hole CH5 for coupling the capacitance forming unit 31 to the capacitance wiring 25 is formed to open at a position that overlaps both the central portion of the capacitance forming unit 31 having a cross-shaped planar shape and the capacitance wiring 25 among the lower layer-side gate insulating film 33 and the first interlayer insulating film 37 (refer to FIG. 2).

Figure 7:
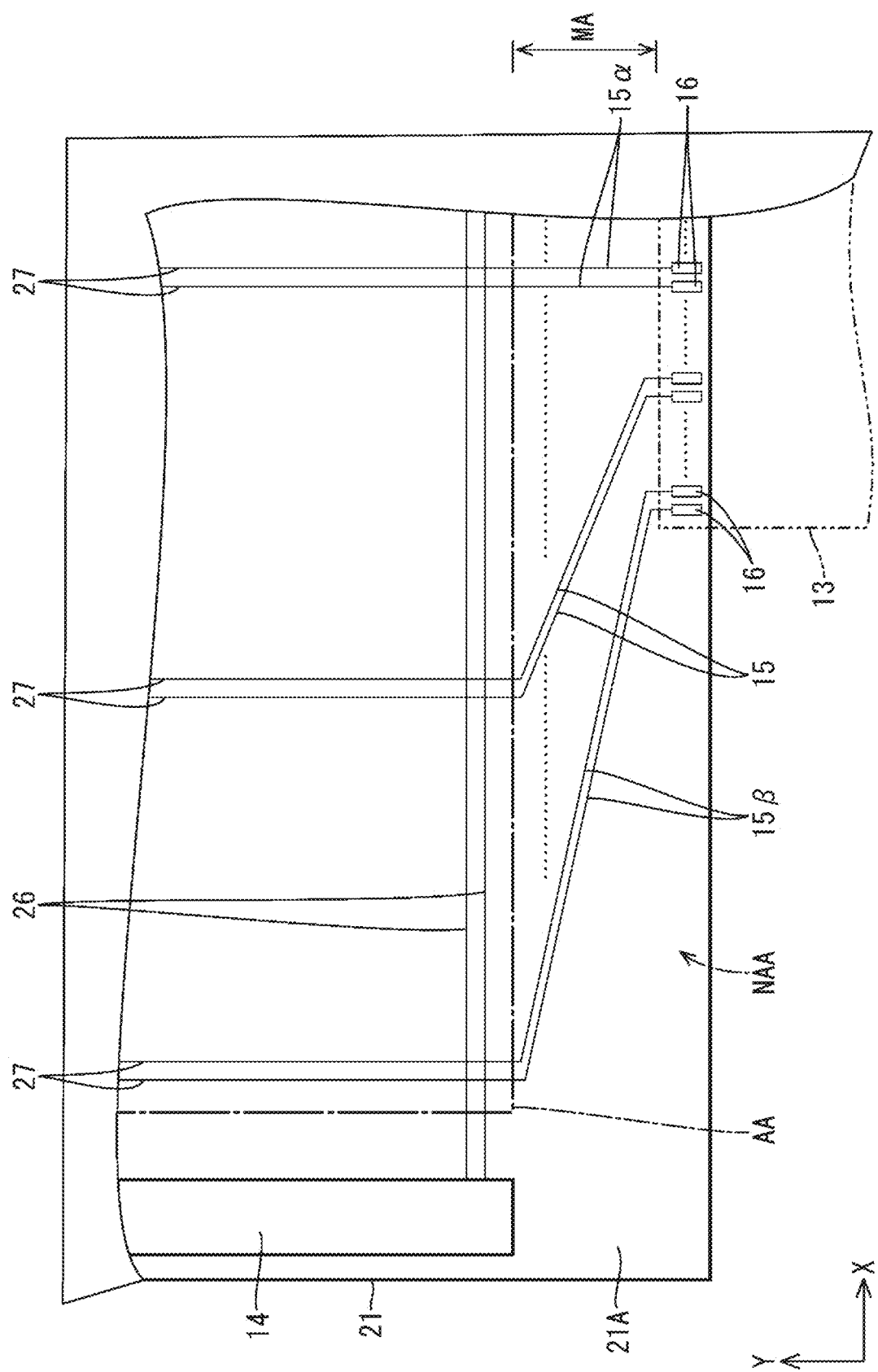
FIG. 7 is a plan view mainly illustrating a coupling wiring on the array substrate.

Next, the coupling wiring 15 will be described with reference to FIG. 7. FIG. 7 is a plan view mainly illustrating the coupling wiring 15 on the non-overlapping portion 21A of the CF substrate on the array substrate 21. As illustrated in FIG. 7, the coupling wiring 15 is disposed in an intermediate region MA interposed between the mounting region and the display region AA of the flexible substrate 13 in the Y axis direction in the non-overlapping portion 21A of the CF substrate on the array substrate 21. In the present embodiment, the disposition direction of the terminal unit 16, the intermediate region MA, and the display region AA in the non-overlapping portion 21A of the CF substrate coincides with the Y axis direction, and the direction orthogonal to the same disposition direction (disposition orthogonal direction) coincides with the X axis direction. The coupling wiring 15 is coupled to the terminal unit 16 provided in the mounting region (terminal region) of the flexible substrate 13 and the source wiring 27 provided in the display region AA in the intermediate region MA. The signal supplied from the terminal unit 16 can be transmitted to the source wiring 27 by the coupling wiring 15. The terminal unit 16 to be coupled to one of the coupling wiring 15 is electrically coupled to a terminal unit provided on the flexible substrate 13 through an anisotropic conductive film called anisotropic conductive film (ACF), receives a signal supplied from the flexible substrate 13, and supplies the signal to the coupling wiring 15. A plurality of source wirings 27 to be coupled to the other of the coupling wiring 15 are disposed in the display region AA at intervals along the X axis direction. Therefore, the plurality of source wirings 27 disposed along the X axis direction include a wiring having a short linear distance from the terminal unit 16 to be coupled and a wiring having a long linear distance from the terminal unit 16 to be coupled. In particular, in the present embodiment, since only one flexible substrate 13 is mounted on the liquid crystal panel 11, the difference in the linear distance from the terminal unit 16 to the source wiring 27 tends to increase. Specifically, the source wiring 27 disposed at the central position in the X axis direction in the display region AA has a linear distance to the terminal unit 16 to be coupled of approximately 11 mm, and the source wiring 27 disposed at the end position in the X axis direction in the display region AA has a linear distance to the terminal unit 16 to be coupled of approximately 328 mm. The difference in the linear distance is caused by the difference in the positional relationship in the X axis direction between each source wiring 27 and each terminal unit 16 to be coupled. Therefore, a difference in wiring resistance occurs between the coupling wiring 15 coupled to each of the source wiring 27 having different linear distances from the terminal unit 16 in magnitude, and even when the same signal is transmitted, there is a concern that a difference in the degree of dullness of those signals may be occur. In the present embodiment, the coupling wiring 15 is directly coupled to the source wiring 27 without passing through another circuit or the like. Therefore, the same number of coupling wiring 15 and terminal units 16 as the number of source wirings 27 are provided.

Hereinafter, when the plurality of coupling wirings 15 are distinguished from each other, the above-described one having a short linear distance is referred to as a "first coupling wiring", and a suffix α is added to the reference numeral. The above-described one having a long linear distance is referred to as a "second coupling wiring", and a suffix β is added to the reference numeral. When these are collectively referred to without distinction, a suffix is not added to the reference numeral. As illustrated in FIG. 7, a first coupling wiring 1506 has a short linear distance from the terminal unit 16 to be coupled to the source wiring 27 as compared with a second coupling wiring 15β, is disposed on the center side in the X axis direction in the intermediate region MA, and can be referred to as a "center side coupling wiring". In the present embodiment, an example is illustrated in which the first coupling wiring 15α extends linearly substantially along the Y axis direction. On the other hand, the second coupling wiring 15β has a longer linear distance from the terminal unit 16 to be coupled to the source wiring 27 as compared with the first coupling wiring 15α, is disposed on the end side in the X axis direction in the intermediate region MA, and can be referred to as a "end-side coupling wiring". In the present embodiment, an example is illustrated in which the second coupling wiring 15β extends mostly along an oblique direction with respect to the X axis direction and the Y axis direction.

Figure 8:
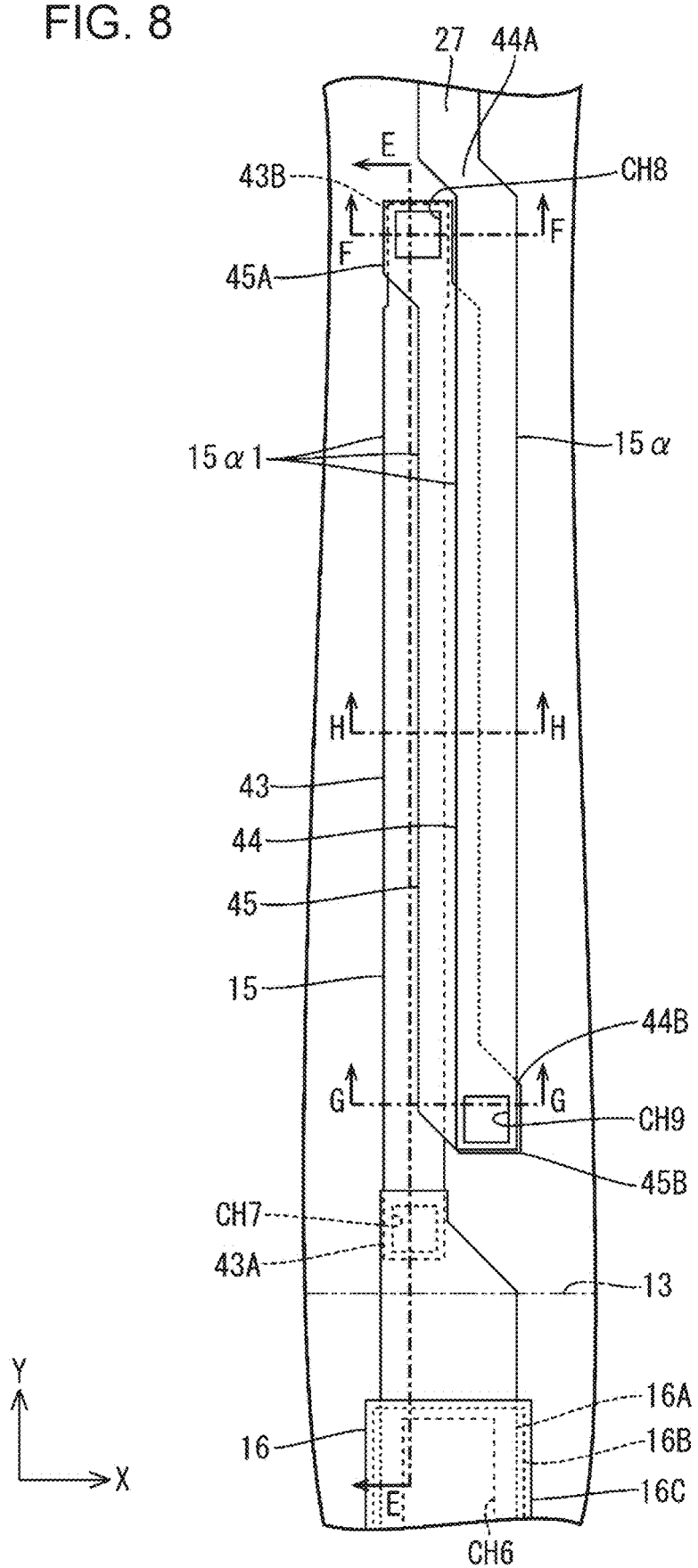
FIG. 8 is a plan view illustrating a first coupling wiring on the array substrate.

As illustrated in FIG. 8, among the coupling wiring 15 according to the present embodiment, the first coupling wiring 1506 coupled to the source wiring 27 having a short linear distance from the terminal unit 16 is folded toward the terminal unit 16 side in the middle of running from the terminal unit 16 to the display region AA. FIG. 8 is a plan view of the first coupling wiring 15α on the array substrate 21. According to such a configuration, it is possible to ensure a sufficiently long extending surface distance of the first coupling wiring 15α from the terminal unit 16 to the coupling to the source wiring 27 to be coupled in the display region AA. As compared with the case where the disposition of the coupling portion can be changed only within the range of the length of the external coupling terminal, since the first coupling wiring 15α is disposed in a folded shape as described above by using the intermediate region MA interposed between the display region AA and the terminal unit 16, the adjustment range related to the wiring resistance of the first coupling wiring 15α is wider. As described above, the difference in wiring resistance that can occur between the first coupling wiring 15α and the second coupling wiring 15β can be sufficiently reduced, and the signal transmission performance of the first coupling wiring 15α and the second coupling wiring 15β can be made uniform.

Specifically, as illustrated in FIG. 8, the first coupling wiring 15α is configured to include three (a plurality of) first coupling wiring constituting portions 15α1. The three first coupling wiring constituting portions 15α1 include a terminal unit coupling portion 43 coupled to the terminal unit 16, a source wiring coupling portion 44 coupled to the source wiring 27, and an intermediate portion 45 coupled to each of the terminal unit coupling portion 43 and the source wiring coupling portion 44. The terminal unit coupling portion 43 extends along the Y axis direction from the terminal unit 16 (mounting region of the flexible substrate 13) in the intermediate region MA toward the display region AA side. In the terminal unit coupling portion 43, a terminal unit-side end portion 43A is disposed at a position adjacent to the terminal unit 16 in the Y axis direction and is coupled to the terminal unit 16, and the display region-side end portion (extension end-side portion) 43B is disposed at a position adjacent to the display region AA in the Y axis direction. The source wiring coupling portion 44 extends along the Y axis direction from the display region AA toward the terminal unit 16 side in the intermediate region MA. In the source wiring coupling portion 44, the display region-side end portion 44A is disposed at a position adjacent to the display region AA in the Y axis direction and is coupled to the source wiring 27, and the terminal unit-side end portion (extension end-side portion) 44B is disposed at a position adjacent to the terminal unit 16 in the Y axis direction. The display region-side end portion 43B of the terminal unit coupling portion 43 is disposed closer to the display region AA side in the Y axis direction from the terminal unit-side end portion 44B of the source wiring coupling portion 44. The intermediate portion 45 extends along the Y axis direction so as to be parallel to the terminal unit coupling portion 43 and the source wiring coupling portion 44 in the intermediate region MA. The display region-side end portion 45A located on the display region AA side is coupled to the display region-side end portion 43B of the terminal unit coupling portion 43, and the terminal unit-side end portion 45B located on the terminal unit 16 side is coupled to the terminal unit-side end portion 44B of the source wiring coupling portion 44, respectively. Therefore, it can be said that the intermediate portion 45 has a length from a position adjacent to the terminal unit 16 in the Y axis direction to a position adjacent to the display region AA, and is routed by maximizing a formation range in the intermediate region MA in the Y axis direction. The intermediate portion 45 is a parallel portion in which a substantially entire area is parallel to the terminal unit coupling portion 43 and the source wiring coupling portion 44. Most of the terminal unit coupling portion 43 and the source wiring coupling portion 44 are parallel portions that are parallel to each other. Based on the above configuration, the signal output from the terminal unit 16 is supplied to the source wiring 27 through the terminal unit coupling portion 43, the intermediate portion 45, and the source wiring coupling portion 44 in this order. More specifically, the signal output from the terminal unit 16 is transmitted from the terminal unit-side end portion 43A to the display region-side end portion 43B in the terminal unit coupling portion 43, transmitted from the display region-side end portion 45A to the terminal unit-side end portion 45B in the intermediate portion 45, further transmitted from the terminal unit-side end portion 44B to the display region-side end portion 44A in the source wiring coupling portion 44, and thereafter supplied to the source wiring 27. As a result, the signal transmission path length (creepage distance of the first coupling wiring 15α) in the first coupling wiring 15α is sufficiently ensured. The terminal unit coupling portion 43, the source wiring coupling portion 44, and the intermediate portion 45 have the same line width, and specifically, are aligned to approximately 8 μm, for example.

Figure 9:
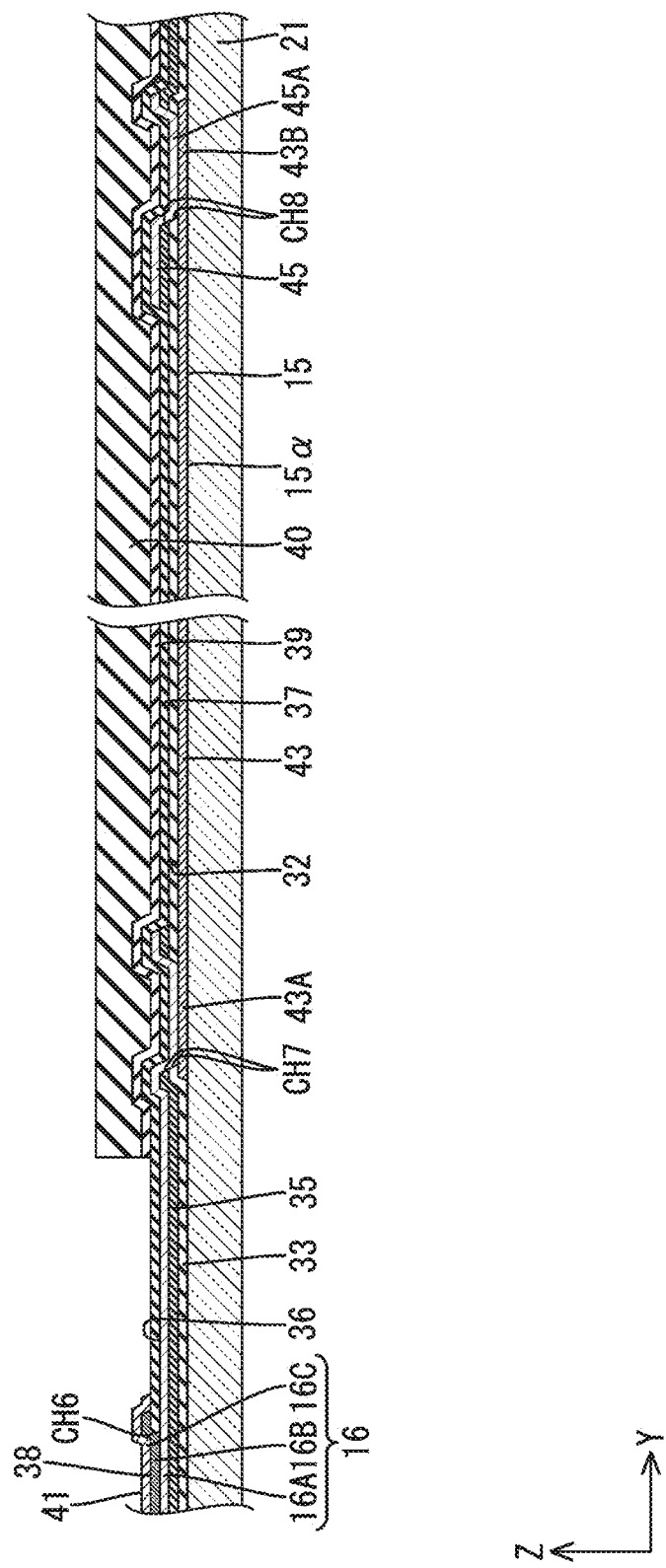
FIG. 9 is a cross-sectional view of the array substrate taken along line E-E of FIG. 8.
Figure 10:
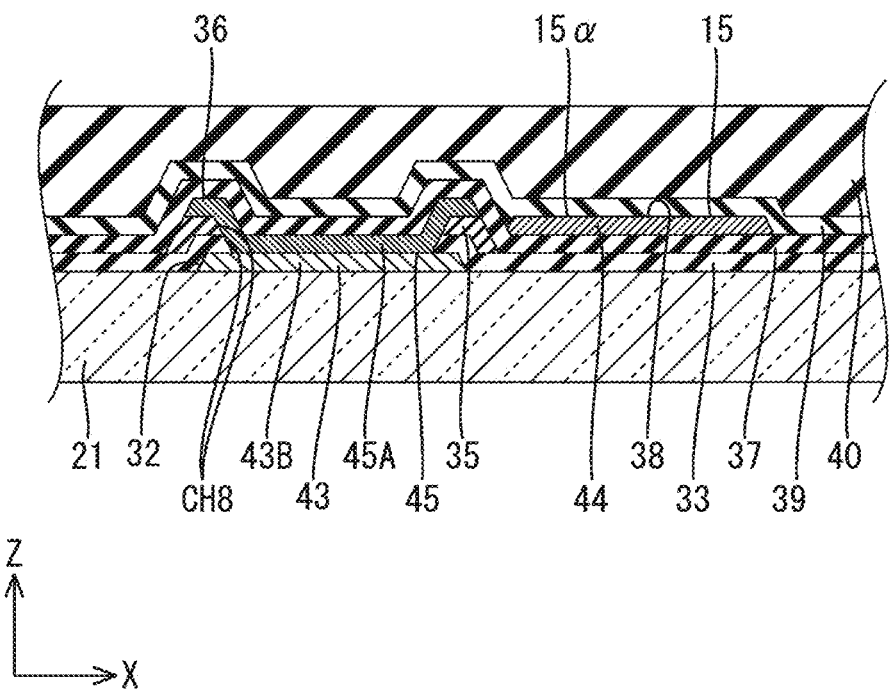
FIG. 10 is a cross-sectional view of the array substrate taken along line F-F of FIG. 8.
Figure 11:
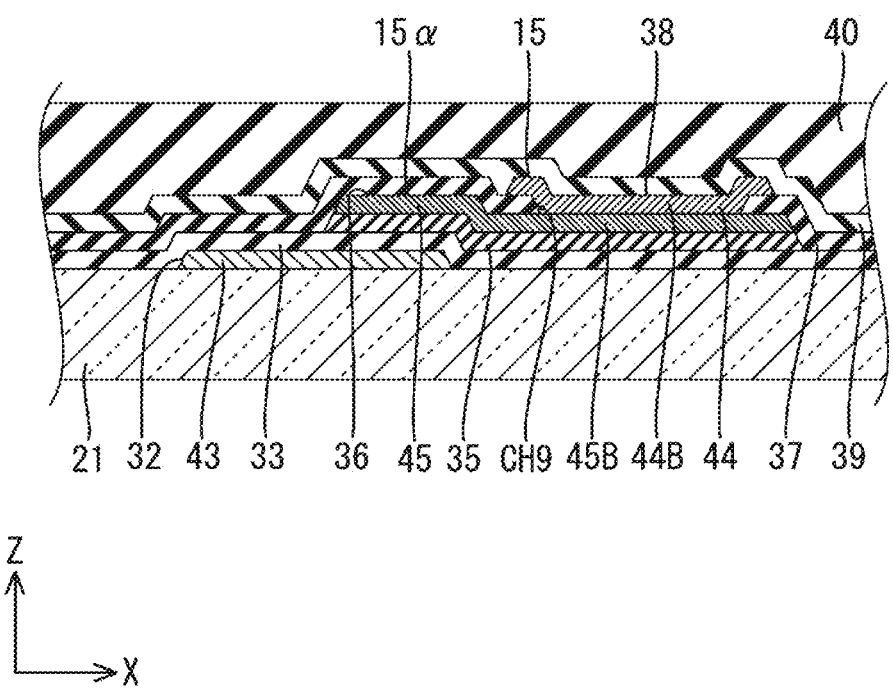
FIG. 11 is a cross-sectional view of the array substrate taken along line G-G of FIG. 8.
Figure 12:
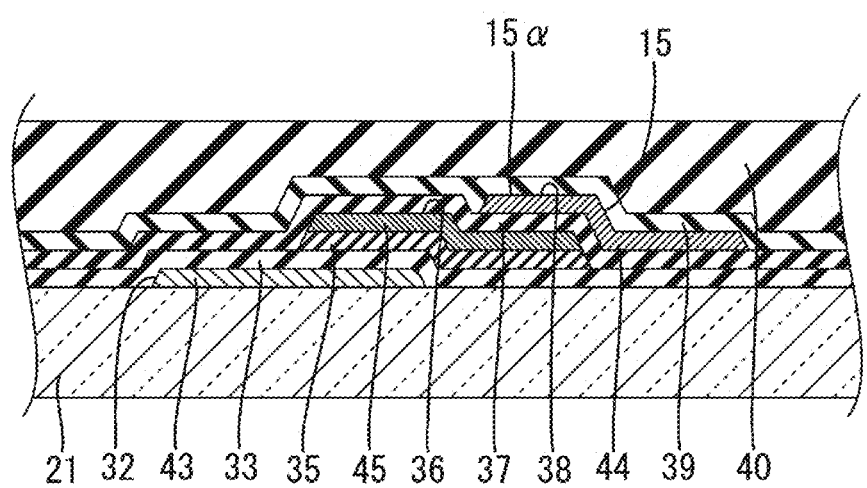
FIG. 12 is a cross-sectional view of the array substrate taken along line H-H of FIG. 8.

As illustrated in FIGS. 9 to 12, the terminal unit coupling portion 43, the source wiring coupling portion 44, and the intermediate portion 45 are respectively formed of the metal films 32, 36, and 38 different from each other. FIG. 9 is a cross-sectional view of the terminal unit coupling portion 43 of the first coupling wiring 15α on the array substrate 21 cut along the extending direction (Y axis direction). FIG. 10 is a cross-sectional view of the vicinity of the coupling portion between the terminal unit coupling portion 43 and the intermediate portion 45 of the first coupling wiring 1506 on the array substrate 21. FIG. 11 is a cross-sectional view of the vicinity of the coupling portion between the source wiring coupling portion 44 and the intermediate portion 45 of the first coupling wiring 1506 on the array substrate 21. FIG. 12 is a cross-sectional view of the vicinity of the central portion of the first coupling wiring 15α on the array substrate 21 cut along the width direction (X axis direction). Specifically, the terminal unit coupling portion 43 is formed of the first metal film 32. The source wiring coupling portion 44 is formed of the third metal film 38 in which the lower layer-side gate insulating film 33, the upper layer-side gate insulating film 35, and the first interlayer insulating film 37 are interposed between the source wiring coupling portion 44 and the first metal film 32. The intermediate portion 45 is formed of the second metal film 36 in which the lower layer-side gate insulating film 33 and the upper layer-side gate insulating film 35 are interposed between the intermediate portion 45 and the first metal film 32, and the first interlayer insulating film 37 is interposed between the intermediate portion 45 and the third metal film 38. As described above, the terminal unit coupling portion 43, the source wiring coupling portion 44, and the intermediate portion 45 are all formed of the metal films 32, 36, and 38 covered by the insulating films 33, 35, 37, 39, and 40. Therefore, as compared with the case where a portion thereof is formed of the transparent electrode film 41 which is not covered by the insulating films 33, 35, 37, 39, and 40, since exposure to the outside is avoided, problems such as intrusion of static electricity and corrosion are unlikely to occur.

The terminal unit coupling portion 43, the source wiring coupling portion 44, and the intermediate portion 45 include portions that at least partially overlap each other through the insulating films 33, 35, and 37. Specifically, as illustrated in FIGS. 9 and 12, the terminal unit coupling portion 43 and the source wiring coupling portion 44 are disposed with a slight interval therebetween in the X axis direction so as not to be overlapped over the entire length. On the other hand, the terminal unit coupling portion 43 and the source wiring coupling portion 44 are disposed so as to partially overlap the intermediate portion 45 in the X axis direction (width direction). In the intermediate portion 45, one side portion in the X axis direction (left side portion illustrated in FIGS. 9 and 12) overlaps the terminal unit coupling portion 43, and the other side portion in the X axis direction (right side portion illustrated in the same drawings) overlaps the source wiring coupling portion 44.

The intermediate portion 45 overlaps both the terminal unit coupling portion 43 and the source wiring coupling portion 44 over substantially the entire length. Therefore, the overall line width of the first coupling wiring 15α is smaller than three times the line width (8 μm) of the terminal unit coupling portion 43, the source wiring coupling portion 44, and the intermediate portion 45. As a result, since the disposition space of the first coupling wiring 15α can be reduced, it is suitable for a case where the number of the source wirings 27 and the coupling wiring 15 is large, or a case where it is difficult to secure a wide intermediate region MA due to a narrow frame. The intermediate portion 45 is disposed such that the overlapping width with respect to the terminal unit coupling portion 43 is slightly larger than the overlapping width with respect to the source wiring coupling portion 44.

Next, the structure of the terminal unit 16 and the coupling structure of the terminal unit 16 and the terminal unit coupling portion 43 will be described. First, as illustrated in FIG. 9, the terminal unit 16 is configured to laminate a first terminal constituting unit 16A formed of the second metal film 36, a second terminal constituting unit 16B formed of the third metal film 38, and a third terminal constituting unit 16C formed of the transparent electrode film 41. A terminal constituting contact hole CH6 is formed to open in the first interlayer insulating film 37 interposed between the first terminal constituting unit 16A and the second terminal constituting unit 16B so as to couple the first terminal constituting unit 16A and the second terminal constituting unit 16B. On the other hand, the second interlayer insulating film 39 and the flattening film 40 are removed in the mounting region of the flexible substrate 13 where the terminal unit 16 is disposed on the array substrate 21. Therefore, the second terminal constituting unit 16B and the third terminal constituting unit 16C are coupled to each other by being directly laminated without interposing a contact hole. Since the second terminal constituting unit 16B formed of the third metal film 38 is covered with the third terminal constituting unit 16C formed of the transparent electrode film 41, the second terminal constituting unit 16B is prevented from being directly exposed to the outside, and problems such as corrosion are unlikely to occur. The first terminal constituting unit 16A formed of the second metal film 36 extends from a position overlapping the second terminal constituting unit 16B and the third terminal constituting unit 16C toward the intermediate region MA side in the Y axis direction, and the extended end portion is coupled to the terminal unit-side end portion 43A of the terminal unit coupling portion 43. A terminal contact hole CH7 for coupling the first terminal constituting unit 16A and the terminal unit-side end portion 43A is formed to open in the lower layer-side gate insulating film 33 and the upper layer-side gate insulating film 35 interposed between the first terminal constituting unit 16A formed of the second metal film 36 and the terminal unit-side end portion 43A of the terminal unit coupling portion 43 formed of the first metal film 32.

Subsequently, a coupling structure in the terminal unit coupling portion 43, the source wiring coupling portion 44, and the intermediate portion 45 will be described. As illustrated in FIGS. 9 and 10, the display region-side end portion 45A of the intermediate portion 45 is coupled to the display region-side end portion 43B of the terminal unit coupling portion 43. A display region-side intermediate portion contact hole CH8 for coupling both display region-side end portions 43B and 45A is formed to open in the lower layer-side gate insulating film 33 and the upper layer-side gate insulating film 35 interposed between the display region-side end portion 45A of the intermediate portion 45 formed of the second metal film 36 and the display region-side end portion 43B of the terminal unit coupling portion 43 formed of the first metal film 32. As illustrated in FIG. 11, in the intermediate portion 45, the terminal unit-side end portion 45B is coupled to the terminal unit-side end portion 44B of the source wiring coupling portion 44. A terminal unit-side intermediate portion contact hole CH9 for coupling both terminal unit-side end portions 44B and 45B is formed to open in the first interlayer insulating film 37 interposed between a terminal unit-side end portion 45B of the intermediate portion 45 formed of the second metal film 36 and a terminal unit-side end portion 44B of the source wiring coupling portion 44 formed of the third metal film 38. As described above, since the intermediate portion 45 is located between the terminal unit coupling portion 43 and the source wiring coupling portion 44 in the Z axis direction as illustrated in FIGS. 9 to 11, any of steps that can occur between the intermediate portion 45, the terminal unit coupling portion 43, and the source wiring coupling portion 44 coupled to each other through the contact holes CH8 and CH9 is reduced. As a result, a problem such as film breakage is unlikely to occur at the coupling portion between the intermediate portion 45, the terminal unit coupling portion 43, and the source wiring coupling portion 44, and high coupling reliability is obtained. Since the terminal unit coupling portion 43 and the source wiring coupling portion 44 are disposed so as not to overlap each other, the display region-side intermediate portion contact hole CH8, which is a coupling structure between the terminal unit coupling portion 43 and the intermediate portion 45, is disposed so as not to overlap the source wiring coupling portion 44, and the terminal unit-side intermediate portion contact hole CH9, which is a coupling structure between the source wiring coupling portion 44 and the intermediate portion 45, is disposed so as not to overlap the terminal unit coupling portion 43. Therefore, it is possible to prevent a step caused by the display region-side intermediate portion contact hole CH8 from being generated in the source wiring coupling portion 44, and it is possible to prevent a step caused by the terminal unit coupling portion 43 from affecting the source wiring coupling portion 44 and the intermediate portion 45 coupled to each other through the terminal unit-side intermediate portion contact hole CH9. As a result, the reliability of the first coupling wiring 15α is enhanced.

Figure 13:
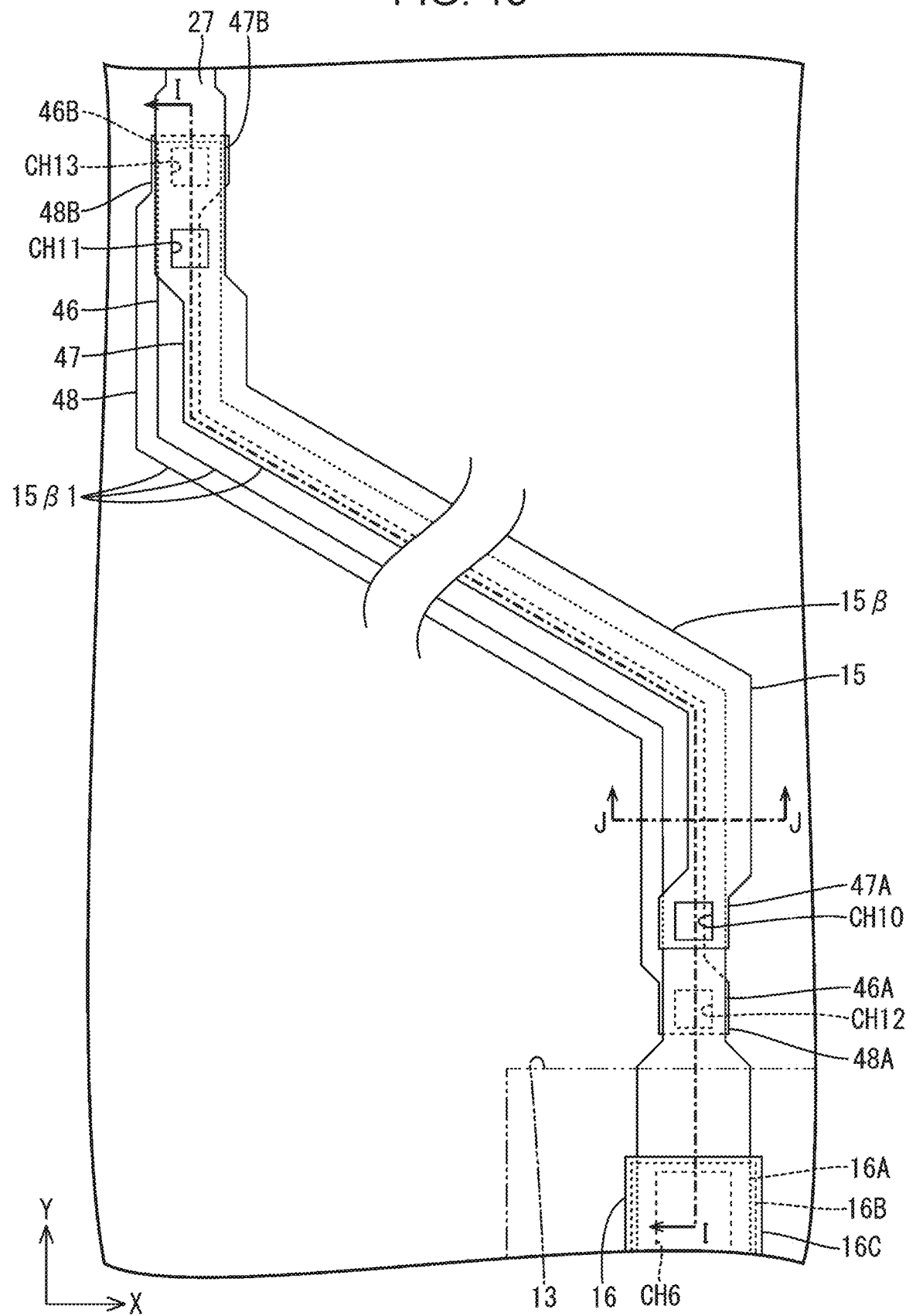
FIG. 13 is a plan view illustrating a second coupling wiring on the array substrate.
Figure 14:
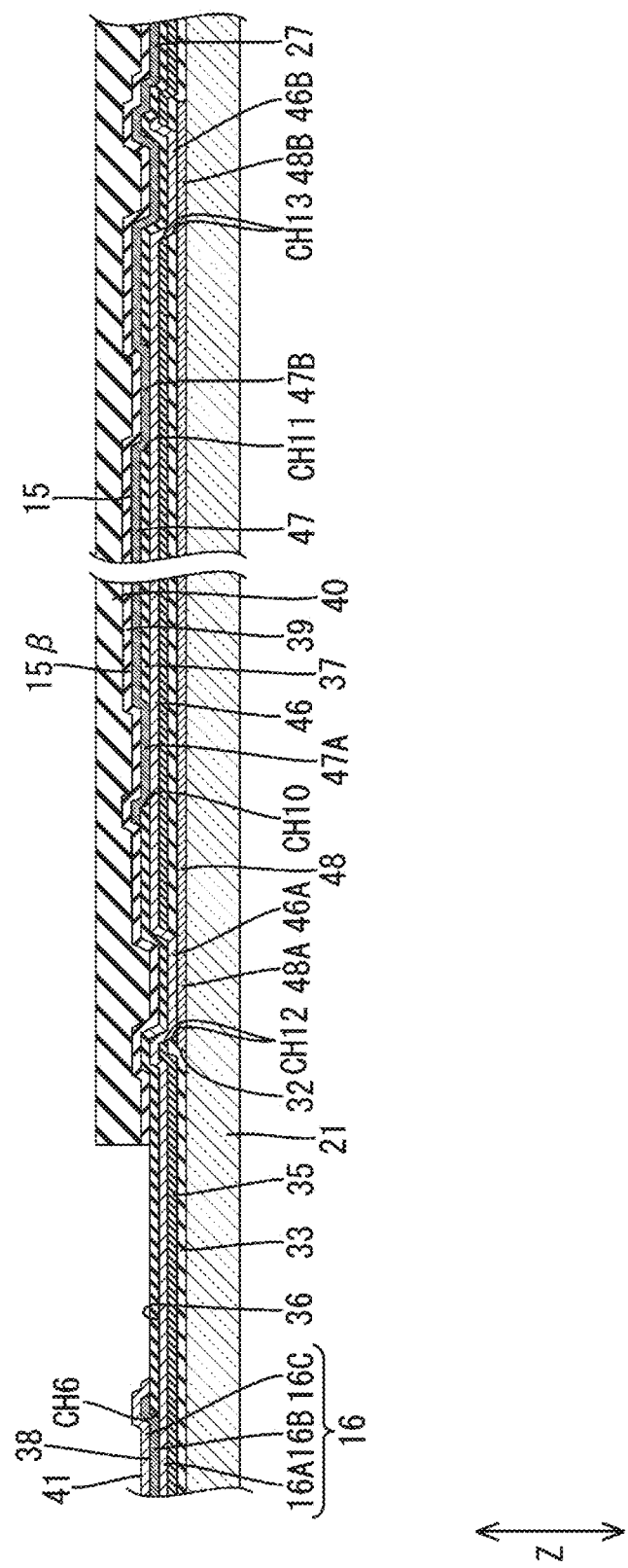
FIG. 14 is a cross-sectional view of the array substrate taken along line I-I of FIG. 13.
Figure 15:
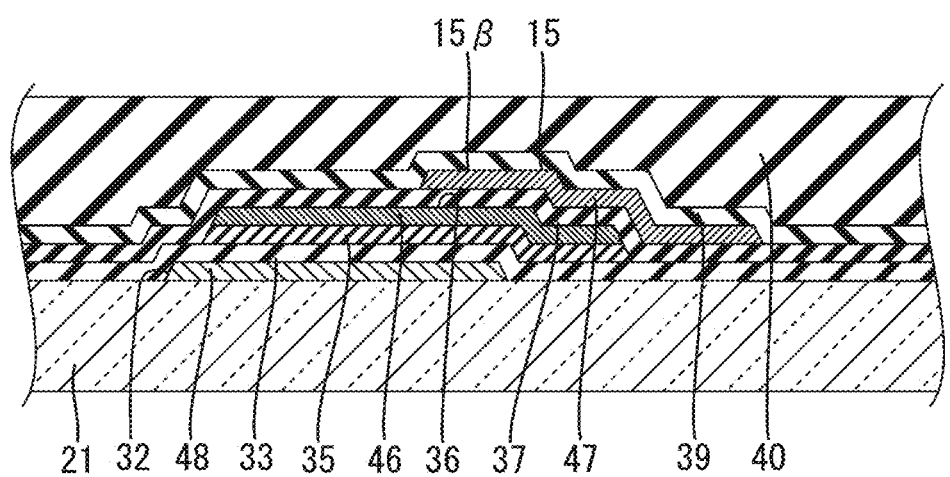
FIG. 15 is a cross-sectional view of the array substrate taken along line J-J of FIG. 13.

Next, the second coupling wiring 15β will be described in detail with reference to FIGS. 13 to 15. FIG. 13 is a plan view of the second coupling wiring 15β on the array substrate 21. FIG. 14 is a cross-sectional view of the second coupling wiring 15β on the array substrate 21 cut along the extending direction. FIG. 15 is a cross-sectional view of the vicinity of the central portion of the second coupling wiring 15β on the array substrate 21. As illustrated in FIG. 13, the second coupling wiring 15β is configured to include three (a plurality of) second coupling wiring constituting portions 15β1. The three second coupling wiring constituting portions 15β1 extend from the terminal unit 16 to the source wiring 27 to be coupled in the display region AA in parallel with each other along the oblique directions in the X axis direction and the Y axis direction. The three second coupling wiring constituting portions 15β1 are formed of the metal films 32, 36, and 38 different from each other, respectively, and are disposed so as to overlap each other through the insulating films 33, 35, and 37. The three second coupling wiring constituting portions 15β1 include a terminal unit coupling portion 46 coupled to the terminal unit 16, a source wiring coupling portion 47 coupled to the source wiring 27 and the terminal unit coupling portion 46, and an auxiliary coupling portion 48 coupled to the terminal unit coupling portion 46.

As illustrated in FIG. 14, the terminal unit coupling portion 46 is formed of the same second metal film 36 as the first terminal constituting unit 16A constituting the terminal unit 16, and is directly coupled to the first terminal constituting unit 16A. The source wiring coupling portion 47 is formed of the same third metal film 38 as the source wiring 27, and is directly coupled to the source wiring 27 to be coupled. The source wiring coupling portion 47 extends in parallel with the terminal unit coupling portion 46, and the terminal unit-side end portion 47A and the display region-side end portion 47B, which are both end portions in the length direction, are respectively coupled to the terminal unit coupling portion 46. Two contact holes CH10 and CH11 between the first coupling portions for coupling both 46 and 47 are formed to open in the first interlayer insulating film 37 interposed between the terminal unit coupling portion 46 formed of the second metal film 36 and the source wiring coupling portion 47 formed of the third metal film 38. The terminal unit-side end portion 46A of the terminal unit coupling portion 46 and the terminal unit-side end portion 47A of the source wiring coupling portion 47 are coupled to each other through the contact hole CH10 between the first coupling portions on the terminal unit side of the first interlayer insulating film 37. The display region-side end portion 46B of the terminal unit coupling portion 46 and the display region-side end portion 47B of the source wiring coupling portion 47 are coupled to each other through the contact hole CH11 between the display region-side first coupling portions of the first interlayer insulating film 37.

As illustrated in FIG. 14, the auxiliary coupling portion 48 is formed of the first metal film 32, extends in parallel with the terminal unit coupling portion 46, and a terminal unit-side end portion 48A and a display region-side end portion 48B, which are both end portions in the length direction, are coupled to the terminal unit coupling portion 46, respectively. Two contact holes CH12 and CH13 between the second coupling portions for coupling both 46 and 48 are formed to open in the lower layer-side gate insulating film 33 and the upper layer-side gate insulating film 35 interposed between the terminal unit coupling portion 46 formed of the second metal film 36 and the auxiliary coupling portion 48 formed of the first metal film 32. The terminal unit-side end portion 46A of the terminal unit coupling portion 46 and the terminal unit-side end portion 48A of the auxiliary coupling portion 48 are coupled to each other through the contact hole CH12 between the second coupling portions on the terminal unit side of the lower layer-side gate insulating film 33 and the upper layer-side gate insulating film 35. The display region-side end portion 46B of the terminal unit coupling portion 46 and the display region-side end portion 48B of the auxiliary coupling portion 48 are coupled to each other through the contact hole CH13 between the second coupling portions on the display region side of the lower layer-side gate insulating film 33 and the upper layer-side gate insulating film 35.

As described above, both end portions 47A, 47B, 48A, and 48B of the source wiring coupling portion 47 and the auxiliary coupling portion 48 are coupled to both end portions 46A and 46B of the terminal unit coupling portion 46, respectively, as illustrated in FIG. 14. Therefore, the substantial line width of the second coupling wiring 15β is equal to the sum of the line widths of these three second coupling wiring constituting portions 15β1. As a result, the wiring resistance of the second coupling wiring 15β, which tends to increase the wiring length, can be reduced, and the difference in wiring resistance that can occur between the second coupling wiring 15β and the first coupling wiring 15α can be suitably reduced. The terminal unit coupling portion 46, the source wiring coupling portion 47, and the auxiliary coupling portion 48, which are the three second coupling wiring constituting portions 15β1, have approximately the same line width, and specifically, are aligned to approximately 10 μm, for example. The line widths of the terminal unit coupling portion 46, the source wiring coupling portion 47, and the auxiliary coupling portion 48, which form the second coupling wiring 15β, are larger than the line widths of the terminal unit coupling portion 43, the source wiring coupling portion 44, and the intermediate portion 45, which form the first coupling wiring 15α. As a result, the wiring resistance of the second coupling wiring 15β is further reduced, and the difference in wiring resistance between the second coupling wiring 15β and the first coupling wiring 15α is further reduced.

Furthermore, as illustrated in FIG. 15, the terminal unit coupling portion 46, the source wiring coupling portion 47, and the auxiliary coupling portion 48, which form the second coupling wiring 15β, are disposed to overlap each other through the insulating films 33, 35, and 37. Specifically, in the terminal unit coupling portion 46, one side portion in the X axis direction (left side portion illustrated in FIGS. 13 and 15) overlaps the auxiliary coupling portion 48, and the other side portion in the X axis direction (right side portion illustrated in the same drawings) overlaps the source wiring coupling portion 47. In the source wiring coupling portion 47, one side portion in the X axis direction (left side portion illustrated in FIGS. 13 and 15) overlaps the auxiliary coupling portion 48, and the central portion in the X axis direction overlaps the terminal unit coupling portion. 46. In the auxiliary coupling portion 48, one side portion in the X axis direction (right side portion illustrated in FIGS. 13 and 15) overlaps the source wiring coupling portion 47, and the central portion in the X axis direction overlaps the terminal unit coupling portion. 46. The terminal unit coupling portion 46, the source wiring coupling portion 47, and the auxiliary coupling portion 48 overlap each other over substantially the entire length. Therefore, the entire line width of the second coupling wiring 15β is smaller than three times the line width (10 μm) of the terminal unit coupling portion 46, the source wiring coupling portion 47, and the auxiliary coupling portion 48. As a result, since the disposition space of the second coupling wiring 15β can be reduced, it is suitable for a case where the number of the source wirings 27 and the coupling wiring 15 is large, or a case where it is difficult to secure a wide intermediate region MA due to a narrow frame.

As described above, the array substrate (wiring substrate) 21 of the present embodiment is provided with a terminal unit (signal supply unit) 16, a plurality of source wirings (wirings) 27 disposed in display region (wiring region) AA where the intermediate region MA is interposed between the source wiring 27 and the terminal unit 16 and have different distances from the terminal unit 16, and a plurality of coupling wirings 15 disposed in the intermediate region MA and coupled to the terminal unit 16 and the plurality of source wirings 27. The coupling wiring 15 includes the first coupling wiring 15α coupled to those of the plurality of source wirings 27 having a short distance from the terminal unit 16, and the second coupling wiring 15β coupled to those of the plurality of source wirings 27 having a long distance from the terminal unit 16. The first coupling wiring 15α is folded back toward the terminal unit 16 in the middle of running from the terminal unit 16 to the display region AA.

In this manner, the signal output from the terminal unit 16 is supplied to the plurality of source wirings 27 disposed in the display region AA through the plurality of coupling wirings 15 disposed in the intermediate region MA. Since the plurality of source wirings 27 include those having a short distance from the terminal unit 16 and those having a long distance from the terminal unit 16, there is a concern that a difference in wiring resistance may occur between the first coupling wiring 15α and the second coupling wiring 15β coupled to these source wiring 27. In this regard, since the first coupling wiring 15α is folded back toward the terminal unit 16 side in the middle of running from the terminal unit 16 to the display region AA, it is possible to ensure a sufficiently large extending surface distance from the terminal unit 16 to the coupling to the source wiring 27 to be coupled in the display region AA. As compared with the case where the disposition of the coupling portion can be changed only within the range of the length of the external coupling terminal, since the first coupling wiring 15α is disposed in a folded shape as described above by using the intermediate region MA interposed between the display region AA and the terminal unit 16, the adjustment range related to the wiring resistance of the first coupling wiring 15α is wider. As described above, the difference in wiring resistance that can occur between the first coupling wiring 15α and the second coupling wiring 15β can be sufficiently reduced, and the signal transmission performance of the first coupling wiring 15α and the second coupling wiring 15β can be made uniform.

The first coupling wiring 15α includes the terminal unit coupling portion (signal supply unit coupling portion) 43 coupled to the terminal unit 16 and extending toward the display region AA side, the source wiring coupling portion (wiring coupling portion) 44 coupled to the source wiring 27 and extending toward the terminal unit 16 side, and the intermediate portion 45 coupled to each of the extension end-side portion of the terminal unit coupling portion 43 and the extension end-side portion of the source wiring coupling portion 44. As described above, since the intermediate portion 45 is coupled to each of the extension end-side portion of the terminal unit coupling portion 43 coupled to the terminal unit 16 and extending toward the display region AA side, and the extension end-side portion of the source wiring coupling portion 44 coupled to the source wiring 27 and extending toward the terminal unit 16 side, the first coupling wiring 15α is configured. Therefore, the creepage distance of the first coupling wiring 15α can be sufficiently ensured.

In the first coupling wiring 15θ, the terminal unit coupling portion 43, the source wiring coupling portion 44, and the intermediate portion 45 are formed of the plurality of metal films (conductive films) 32, 36, and 38 with insulating films 33, 35, and 37 interposed therebetween. The terminal unit coupling portion 43, the source wiring coupling portion 44, and the intermediate portion 45 include portions that at least partially overlap each other through the insulating films 33, 35, and 37. In this manner, as compared with the case where the first coupling wiring is formed of a single conductive film, the terminal unit coupling portion 43, the source wiring coupling portion 44, and the intermediate portion 45 include portions that at least partially overlap each other through the insulating films 33, 35, and 37, so that the disposition space for the first coupling wiring 15α can be reduced. Therefore, it is suitable for a case where the number of the source wirings 27 and the coupling wiring 15 is large, or a case where it is difficult to secure a wide intermediate region MA.

The terminal unit coupling portion 43, the source wiring coupling portion 44, and the intermediate portion 45 are formed of the metal films (conductive films) 32, 36, and 38 different from each other. The terminal unit coupling portion 43 and the source wiring coupling portion 44 is disposed so as not to overlap each other, and the intermediate portion 45 is disposed so as to partially overlap the terminal unit coupling portion 43 and the source wiring coupling portion 44, respectively. The terminal unit coupling portion 43 and the source wiring coupling portion 44 are not directly coupled to each other, and are coupled to the intermediate portion 45, respectively. Since the terminal unit coupling portion 43 and the source wiring coupling portion 44 are disposed so as not to overlap each other, it is possible to prevent a step caused by each coupling structure between the terminal unit coupling portion 43, the source wiring coupling portion 44, and the intermediate portion 45 from being generated in the terminal unit coupling portion 43 and the source wiring coupling portion 44, or a step caused by the terminal unit coupling portion 43 and the source wiring coupling portion 44 from affecting each coupling structure between the terminal unit coupling portion 43, the source wiring coupling portion 44, and the intermediate portion 45. As a result, the reliability of the first coupling wiring 15α is enhanced.

The terminal unit coupling portion 43, the source wiring coupling portion 44, and the intermediate portion 45 are formed of the metal films (conductive films) 32, 36, and 38 different from each other. The intermediate portion 45 is formed of the second metal film 36 (conductive film) located at an intermediate position between both the first metal film (conductive film) 32 constituting the terminal unit coupling portion 43 and the third metal film (conductive film) 38 constituting the source wiring coupling portion 44 through the insulating films 33, 35, and 37, respectively, and is coupled to the terminal unit coupling portion 43 and the source wiring coupling portion 44 through the contact holes CH8 and CH9 formed to open in the insulating films 33, 35, and 37, respectively. As described above, the second metal film 36 constituting the intermediate portion 45 is located at an intermediate position between both the first metal film 32 constituting the terminal unit coupling portion 43 and the third metal film 38 constituting the source wiring coupling portion 44 through the insulating films 33, 35, and 37, respectively. Therefore, steps are all small that can occur between the intermediate portion 45, the terminal unit coupling portion 43, and the source wiring coupling portion 44 coupled to each other through the contact holes CH8 and CH9 formed to open in the insulating films 33, 35, and 37 interposed between the second metal film 36 constituting the intermediate portion 45, the first metal film 32 constituting the terminal unit coupling portion 43, and the third metal film 38 constituting the source wiring coupling portion 44, respectively. As a result, a problem such as film breakage is unlikely to occur at the coupling portion between the intermediate portion 45, the terminal unit coupling portion 43, and the source wiring coupling portion 44, and high coupling reliability is obtained.

In the first coupling wiring 15α, the display region-side end portion (extension end-side portion) 43B of the terminal unit coupling portion 43 is configured to be disposed closer to the display region AA side from the terminal-side end portion (extension end-side portion) 44B of the source wiring coupling portion 44. In this manner, as compared with a case where the display region-side end portion of the terminal unit coupling portion 43 is disposed closer to the terminal unit 16 side from the terminal-side end portion 44B of the source wiring coupling portion 44, the terminal unit coupling portion 43 and the source wiring coupling portion 44 can be routed longer, and the creepage distance of the first coupling wiring 15α can be further increased. As a result, a difference in wiring resistance that can occur between the first coupling wiring 15α and the second coupling wiring 15β can be further reduced.

The first coupling wiring 15α is configured to be disposed such that the display region-side end portion 43B of the terminal unit coupling portion 43 is adjacent to the display region AA and the terminal-side end portion 44B of the source wiring coupling portion 44 is adjacent to the terminal unit 16. In this manner, the lengths of the terminal unit coupling portion 43 and the source wiring coupling portion 44 can be set to a size maximizing the intermediate region MA, and the creepage distance of the first coupling wiring 15α can be further increased. As a result, a difference in wiring resistance that can occur between the first coupling wiring 15α and the second coupling wiring 15β can be further reduced.

In the first coupling wiring 15α, the terminal unit coupling portion 43, the source wiring coupling portion 44, and the intermediate portion 45 are formed of the plurality of metal films (conductive films) 32, 36, and 38 with the insulating films 33, 35, and 37 interposed therebetween. The terminal unit coupling portion 43, the source wiring coupling portion 44, and the intermediate portion 45 have parallel portions parallel to each other, and the parallel portions include portions that at least partially overlap each other through the insulating films 33, 35, and 37. In this manner, as compared with the case where the first coupling wiring is formed of a single conductive film, the disposition space of the first coupling wiring 15α can be reduced. However, the terminal unit coupling portion 43, the source wiring coupling portion 44, and the intermediate portion 45 each have parallel portions parallel to each other, and the parallel portions include portions that at least partially overlap each other through the insulating films 33, 35, and 37, so that the disposition space of the first coupling wiring 15α can be further reduced.

The second coupling wiring 15β includes a plurality of second coupling wiring constituting portions 15β1 formed of the plurality of metal films (conductive films) 32, 36, and 38 with the insulating films 33, 35, and 37 interposed therebetween, and coupled to each other. In this manner, as compared with the case where the second coupling wiring is formed of a single conductive film, it is suitable to reduce the wiring resistance in the second coupling wiring 15β formed of a plurality of second coupling wiring constituting portions 15β1 coupled to each other. As a result, a difference in wiring resistance that can occur between the first coupling wiring 15α and the second coupling wiring 15β can be further reduced.

The plurality of second coupling wiring constituting portions 15β1 include portions that at least partially overlap each other through the insulating films 33, 35, and 37. In this manner, as compared with the case where the plurality of second coupling wiring constituting portions are disposed so as not to overlap each other, it is suitable to reduce the wiring resistance in the second coupling wiring 15β and to reduce the disposition space.

The second coupling wiring 15β includes three or more second coupling wiring constituting portions 15β1, and the three or more second coupling wiring constituting portions 15β1 are disposed in parallel with each other, and to overlap each other through the insulating films 33, 35, and 37. In this manner, the disposition space of the second coupling wiring 15β can be further reduced.

A plurality of gate wirings (second wirings) 26 are provided in the display region AA and extend so as to intersect the source wiring 27. A plurality of source wirings 27 are disposed such that an arrangement interval thereof is larger than an arrangement interval of the plurality of gate wirings 26. As described above, when the arrangement interval of the plurality of source wirings 27 is set to be larger than the arrangement interval of the plurality of gate wirings 26, as compared with a case where the size relation of the arrangement interval is reversed, the number of the source wirings 27 and the terminal units 16 coupled to the source wiring 27 is reduced, and the width of the region where the terminal unit 16 is formed (width of the mounting region on the flexible substrate 13) tends to be reduced. Therefore, the difference in the distance between the terminal unit 16 and the plurality of source wirings 27 increases. Even in such a case, since the first coupling wiring 15α is folded back toward the terminal unit 16 side in the intermediate region MA in the middle of running from the terminal unit 16 to the display region AA, the difference in wiring resistance that can occur between the first coupling wiring 15α and the second coupling wiring 15β is sufficiently reduced. Therefore, the signal transmission performance of the first coupling wiring 15α and the second coupling wiring 15β can be made uniform.

The liquid crystal panel (display device) 11 according to the present embodiment is provided with the array substrate 21 described above and the plurality of pixel units PX disposed in the display region AA and coupled to the plurality of source wirings 27. According to such a liquid crystal panel 11, an image is displayed by supplying signals transmitted by the plurality of source wirings 27 to the plurality of pixel units PX disposed in the display region AA. Since the signal transmission performance of the first coupling wiring 15α and the second coupling wiring 15β for transmitting a signal from the terminal unit 16 to the plurality of source wirings 27 is uniform, the display gradation in the plurality of pixel units PX is appropriate, and excellent display quality can be obtained.

Embodiment 2

Embodiment 2 of the present disclosure will be described with reference to FIG. 16. In Embodiment 2, a configuration in which a configuration of a first coupling wiring 115α is changed is illustrated. A duplicate description of the same structure, operation, and effect as those in Embodiment 1 will not be repeated.

Figure 16:
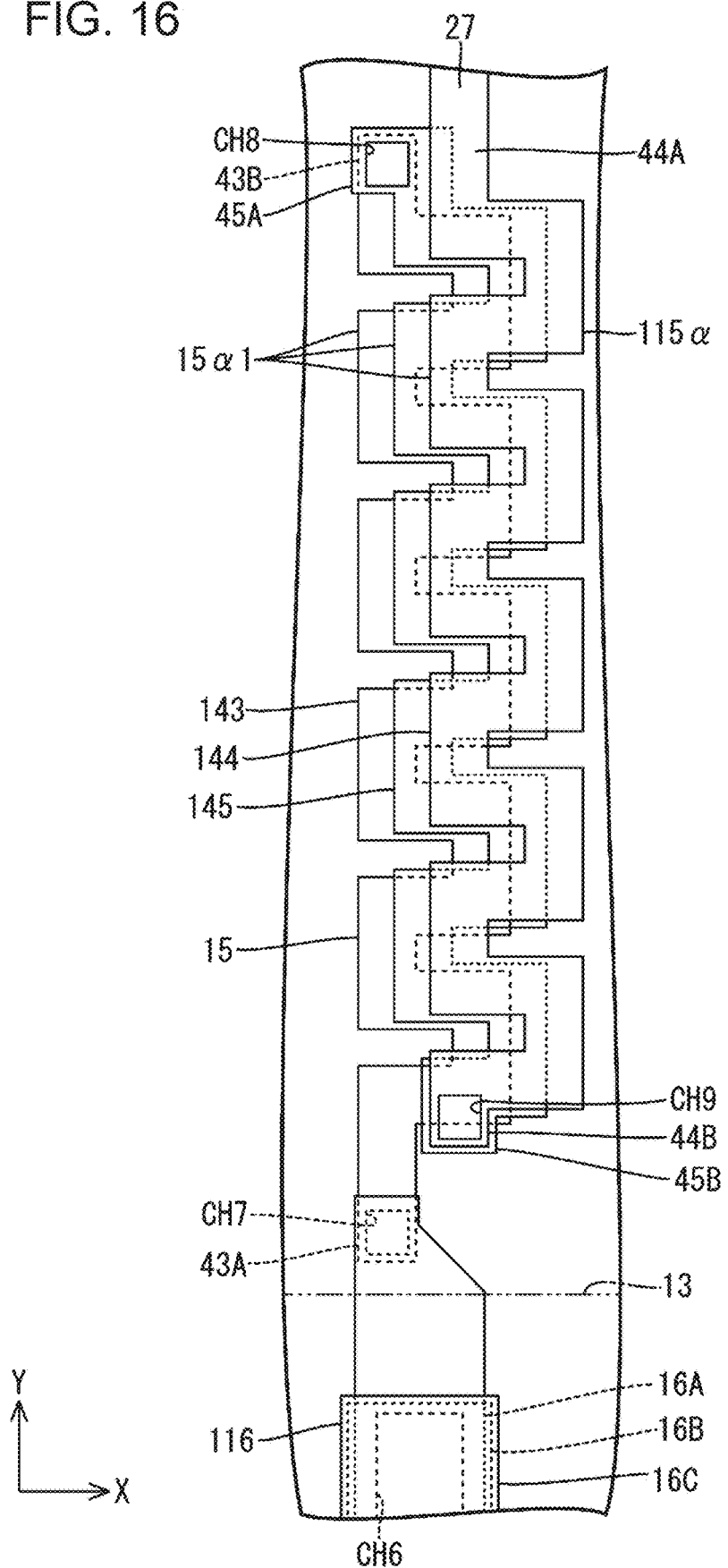
FIG. 16 is a plan view illustrating a first coupling wiring on an array substrate constituting a liquid crystal panel according to Embodiment 2 of the present disclosure.

The first coupling wiring 115α according to the present embodiment is meandered in a zigzag shape as illustrated in FIG. 16. Specifically, a terminal unit coupling portion 143, a source wiring coupling portion 144, and an intermediate portion 145, which form the first coupling wiring 115α, are all extends toward a terminal unit 116 or the display region AA side in the Y axis direction, while repeatedly meandering left and right illustrated in FIG. 16 in the middle of running in the X axis direction. The present embodiment is different from Embodiment 1 described above in that a portion of the terminal unit coupling portion 143 and a portion of the source wiring coupling portion 144 are disposed to overlap each other. That is, the terminal unit coupling portion 143, the source wiring coupling portion 144, and the intermediate portion 145 are disposed so as to overlap each other. In this manner, the creepage distance of the first coupling wiring 115α can be further increased. As a result, the difference in wiring resistance that can occur between the first coupling wiring 115α and the second coupling wiring 15β (refer to FIG. 13) can be further reduced.

As described above, according to the present embodiment, the first coupling wiring 115α is folded back while being meandered in a zigzag shape. In this manner, the creepage distance of the first coupling wiring 115α can be further increased. As a result, a difference in wiring resistance that can occur between the first coupling wiring 115α and the second coupling wiring 15β can be further reduced.

Embodiment 3

Embodiment 3 of the present disclosure will be described with reference to FIGS. 17 to 22. In Embodiment 3, an array substrate 51 provided in an organic EL display panel (organic EL display device) 50 will be described. A duplicate description of the same structure, operation, and effect as those in Embodiment 1 will not be repeated.

Figure 17:
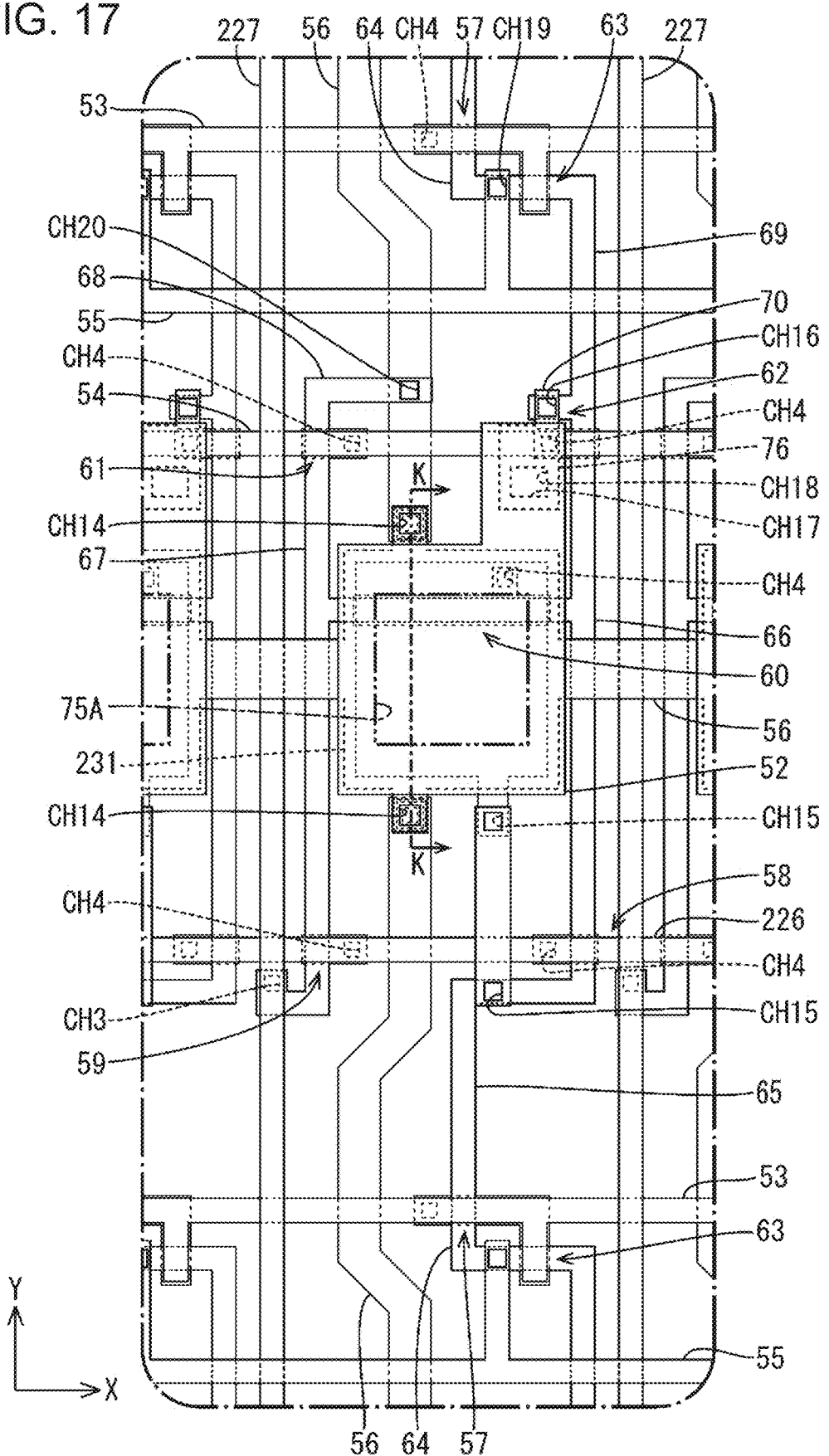
FIG. 17 is a plan view illustrating a pixel array on an array substrate constituting an organic EL display panel according to Embodiment 3 of the present disclosure.

As illustrated in FIG. 17, the organic EL display panel 50 according to the present embodiment is provided with the array substrate 51 on which various wirings and the like are formed. FIG. 17 is a plan view illustrating a pixel array on the array substrate 51. In this embodiment, an organic EL device layer (light emitting unit), a cathode-side electrode layer, a sealing layer, and the like are laminated on the array substrate 51. The organic EL device layer has a known configuration including a hole injection layer, a hole transport layer, an electron injection layer, an electron transport layer, a light emitting layer, and the like. The light emitting layer is interposed between the hole transport layer and the electron transport layer, and emits light by exciting a light emitting substance contained in the light emitting layer by energy generated by a combination of holes and electrons in the light emitting layer. The light emitted from the light emitting layer is emitted toward the side opposite to the array substrate 51 side in the Z axis direction (thickness direction). That is, the organic EL display panel 50 according to the present embodiment is a so-called top emission type. Hereinafter, a detailed configuration of the array substrate 51 will be described.

As illustrated in FIG. 17, the array substrate 51 is provided with an anode-side electrode (electrode unit) 52 constituting the pixel unit PX as a display unit. The anode-side electrode 52 functions as a "reflection electrode" that reflects light emitted from the light emitting layer and directs the light in the Z axis direction to the side opposite to the array substrate 51 side. The anode-side electrodes 52 have a substantially rectangular shape in a plan view, and are arranged side by side in a matrix at a plurality of intervals along the X axis direction and the Y axis direction. A plurality of gate wirings 226 and a plurality of source wirings 227 are arranged so as to partition between these anode-side electrodes 52. The array substrate 51 is provided with a sub-gate wiring 53, an EM wiring 54, and an initialization power supply wiring 55 extending in parallel with a gate wiring 226, respectively. The sub-gate wiring 53 and the initialization power supply wiring 55 are disposed at intervals on the side opposite to the anode-side electrode 52 side in the Y axis direction with respect to the gate wiring 226. The initialization power supply wiring 55 are disposed at intervals on the side opposite to the gate wiring 226 side in the Y axis direction with respect to the sub-gate wiring 53, and are disposed so as to be interposed between the sub-gate wiring 53 and the EM wiring 54 related to the pixel unit PX in the preceding ((n−1)-th) scanning order. In the present embodiment, the scanning of the pixel unit PX is performed from the lower side to the upper side illustrated in FIG. 17. The EM wiring 54 are disposed at intervals on the side opposite to the gate wiring 226 in the Y axis direction with respect to the anode-side electrode 52. Furthermore, an anode-side power supply wiring (power supply wiring) 56 which is formed in a lattice shape extending along the X axis direction and the Y axis direction and is disposed so as to straddle all the anode-side electrodes 52 is provided on the array substrate 51. Detailed functions and the like of these wirings 53 to 56 will be described later.

Figure 18:
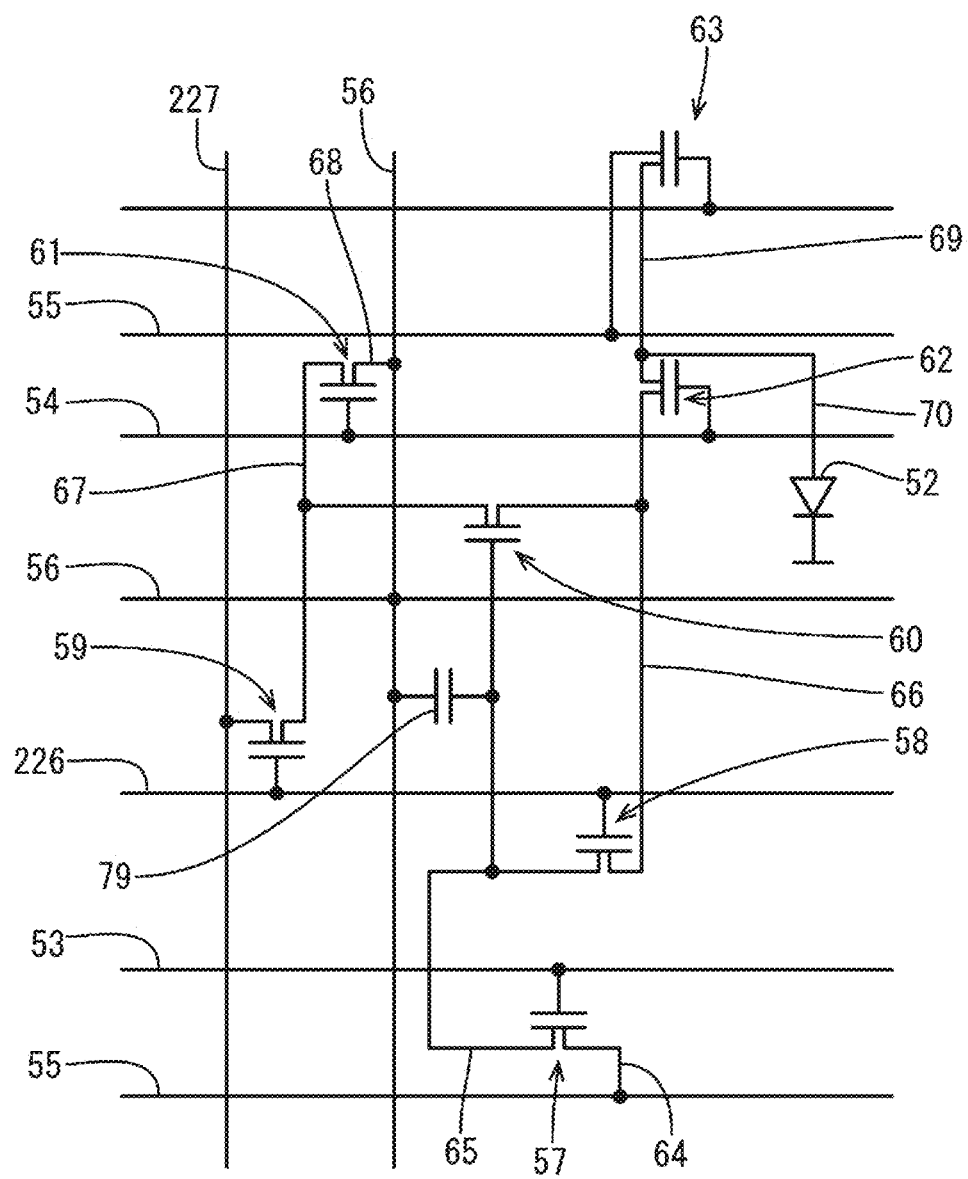
FIG. 18 is a circuit diagram illustrating an electrical configuration of a pixel on the array substrate.

As illustrated in FIGS. 17 and 18, the array substrate 51 is provided with seven TFTs 57 to 63 for one pixel unit PX in order to apply a voltage to the anode-side electrode 52 described above. FIG. 18 is a circuit diagram illustrating an electrical configuration of the pixel unit PX on the array substrate 51. Each of the seven TFTs 57 to 63 includes an upper layer-side gate electrode, a source region, a drain region, a channel region, and a lower layer-side gate electrode. The basic configuration of each of the TFTs 57 to 63 according to the present embodiment is substantially the same as the TFT 23 (refer to FIGS. 5 and 6) described in Embodiment 1. In the present embodiment, the notation of the reference numerals related to the components provided in each of the TFTs 57 to 63 is omitted.

As illustrated in FIGS. 17 and 18, in the first TFT 57 among the seven TFTs 57 to 63, the upper layer-side gate electrode and the lower layer-side gate electrode are coupled to the sub-gate wiring 53, the source region is coupled to the first coupling wiring 64, and the drain region is coupled to the second coupling wiring 65, respectively. In the second TFT 58, the upper layer-side gate electrode and the lower layer-side gate electrode are coupled to the gate wiring 226, the source region is coupled to the third coupling wiring 66, and the drain region is coupled to the second coupling wiring 65, respectively. In the third TFT 59, the upper layer-side gate electrode and the lower layer-side gate electrode are coupled to the same gate wiring 226 as the second TFT 58, the source region is coupled to the source wiring 227, and the drain region is coupled to the fourth coupling wiring 67, respectively. In the fourth TFT 60, the upper layer-side gate electrode and the lower layer-side gate electrode are coupled to the second coupling wiring 65, the source region is coupled to the fourth coupling wiring 67, and the drain region is coupled to the third coupling wiring 66, respectively. In the fifth TFT 61, the upper layer-side gate electrode and the lower layer-side gate electrode are coupled to the EM wiring 54, the source region is coupled to the fifth coupling wiring 68, and the drain region is coupled to the fourth coupling wiring 67, respectively. In the sixth TFT 62, the upper layer-side gate electrode and the lower layer-side gate electrode are coupled to the same EM wiring 54 as the fifth TFT 61, the source region is coupled to the third coupling wiring 66, and the drain region is coupled to the sixth coupling wiring 69, respectively. In the seventh TFT 63, the upper layer-side gate electrode and the lower layer-side gate electrode are coupled to the sub-gate wiring 53 provided in the pixel unit PX in the subsequent ((n+1)-th) scanning order, the source region is coupled to the first coupling wiring 64 provided in the pixel unit PX in the subsequent ((n+1)-th) scanning order, and the drain region is coupled to is the sixth coupling wiring 69, respectively.

As illustrated in FIGS. 17 and 18, the first coupling wiring 64 is coupled to the source region of the first TFT 57, the source region of the seventh TFT 63 provided in the pixel unit PX in the preceding ((n−1)-th) scanning order, and the initialization power supply wiring 55, respectively. The second coupling wiring 65 is coupled to the drain region of the first TFT 57, the drain region of the second TFT 58, and the upper layer-side gate electrode and the lower layer-side gate electrode of the fourth TFT 60, respectively. The third coupling wiring 66 is coupled to the source region of the second TFT 58, the drain region of the fourth TFT 60, and the source region of the sixth TFT 62, respectively. The fourth coupling wiring 67 is coupled to the drain region of the third TFT 59, the source region of the fourth TFT 60, and the drain region of the fifth TFT 61, respectively. The fifth coupling wiring 68 is coupled to the source region of the fifth TFT 61 and the anode-side power supply wiring 56, respectively. The sixth coupling wiring 69 is coupled to the drain region of the sixth TFT 62 and the drain region of the seventh TFT 63, respectively. Furthermore, the array substrate 51 is provided with a seventh coupling wiring 70 coupled to the sixth coupling wiring 69 and the anode-side electrode 52.

Figure 19:
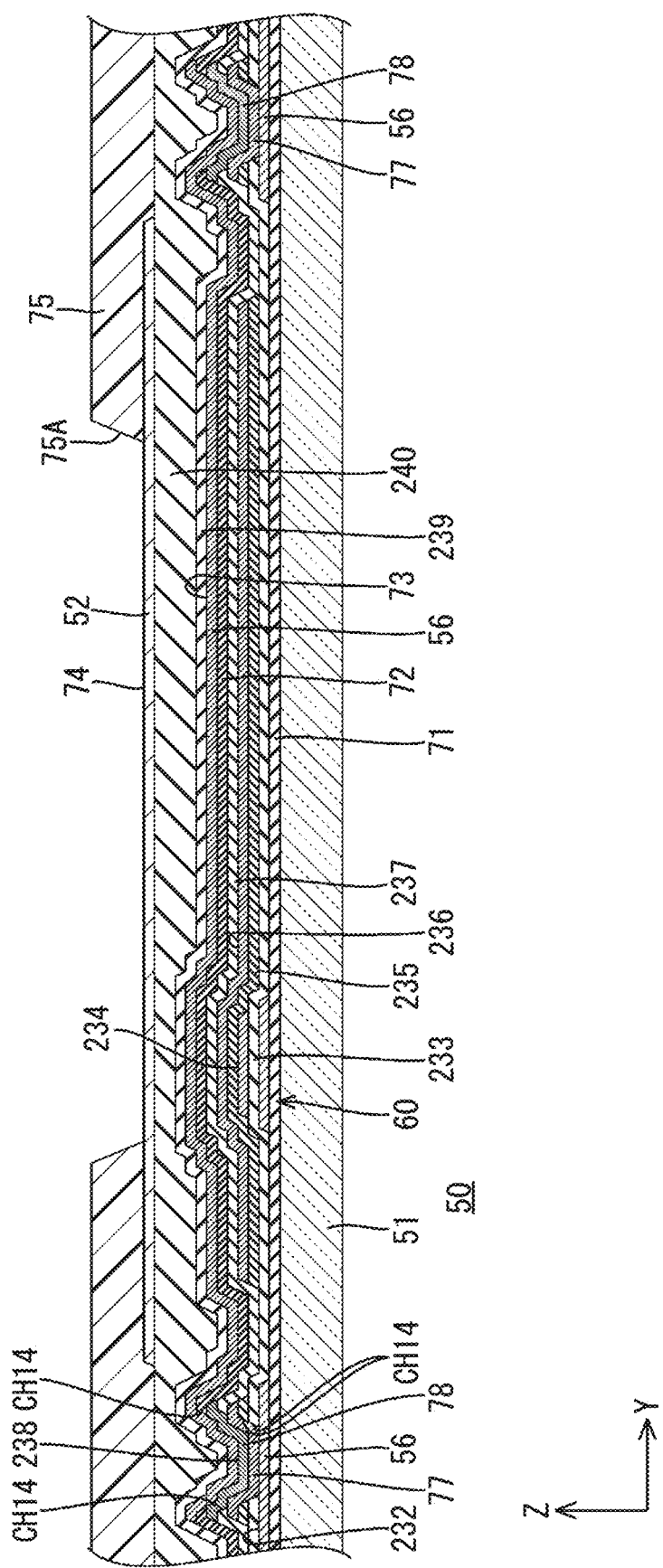
FIG. 19 is a cross-sectional view taken along line K-K of FIG. 17 on the array substrate.

Next, each film laminated on the array substrate 51 will be described with reference to FIG. 19. FIG. 19 is a cross-sectional view of the array substrate 51. As illustrated in FIG. 19, the array substrate 51 is common to the array substrate 21 (refer to FIG. 5) constituting the liquid crystal panel 11 described in Embodiment 1 described above in that the array substrate 51 is provided with the first metal film 232, the lower layer-side gate insulating film 233, the semiconductor film 234, the upper layer-side gate insulating film 235, the second metal film 236, the first interlayer insulating film 237, the third metal film 238, the second interlayer insulating film 239, and the flattening film 240. On the other hand, the array substrate 51 according to the present embodiment is different from Embodiment 1 described above in that the array substrate 51 is provided with a base coat film 71 disposed on a lower layer side of the first metal film 232, a third interlayer insulating film 72 disposed on an upper layer side of the third metal film 238, a fourth metal film 73 disposed on an upper layer side of the third interlayer insulating film 72 and a lower layer side of the second interlayer insulating film 239, a fifth metal film 74 disposed on an upper layer side of the flattening film 240, and a protection layer 75 disposed on an upper layer side of the fifth metal film 74. Each of the fourth metal film 73 and the fifth metal film 74 is formed of a single layer film formed of one type of metal material, or laminated films or alloys formed of different types of metal materials, and thus has conductivity and light shielding property. Each of the base coat film 71 and the third interlayer insulating film 72 is formed of an inorganic insulating material, similarly to the lower layer-side gate insulating film 233 and the like. The protection layer 75 is formed of an organic insulating material such as polyimide. Although the protection layer 75 covers the outer peripheral end portion of the anode-side electrode 52, a portion overlapping with the center-side portion is open, and an organic EL device layer is deposited on the anode-side electrode 52 through this opening portion 75A.

Figure 20:
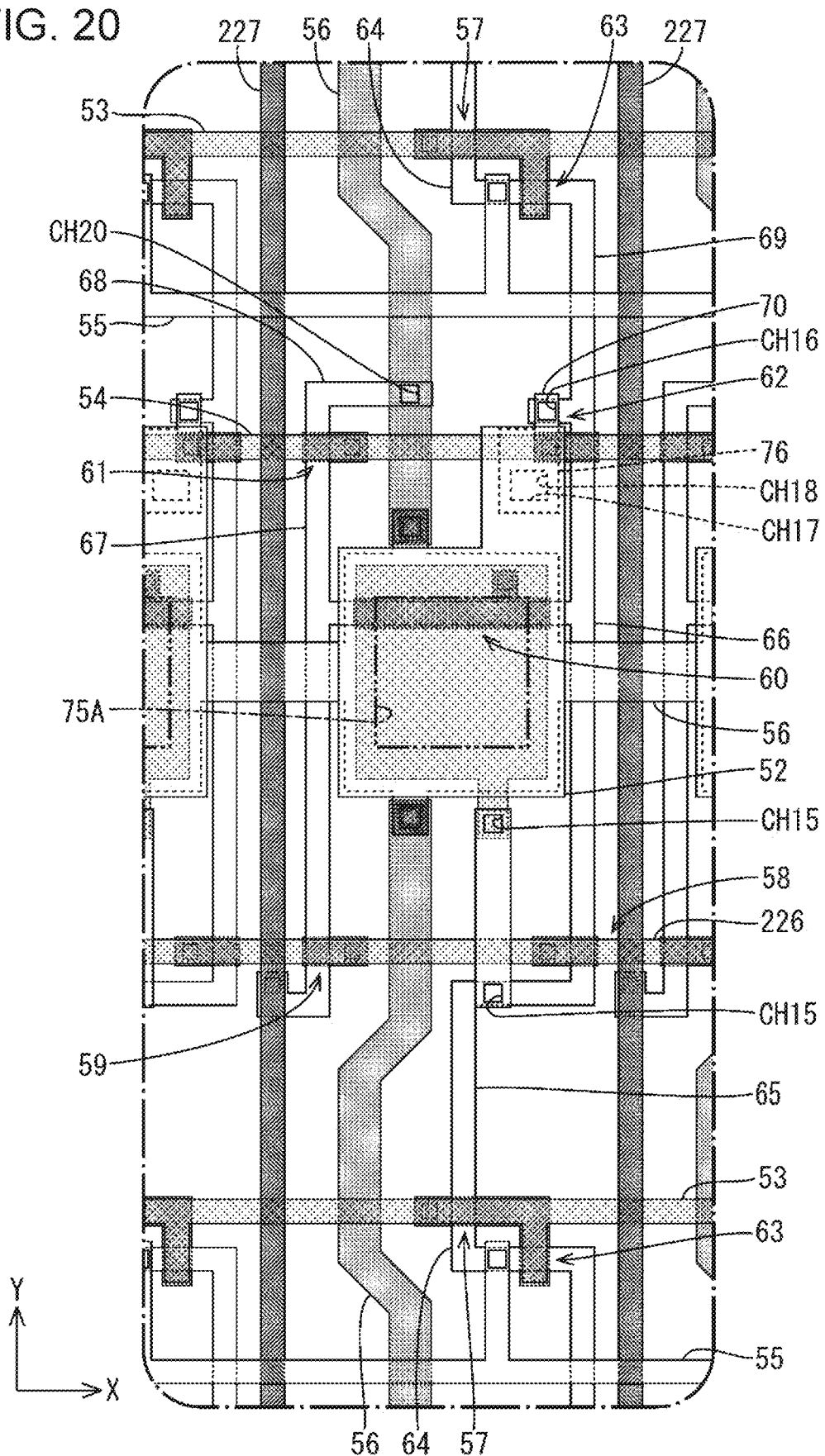
FIG. 20 is a plan view mainly illustrating patterns of a first metal film, a second metal film, and a third metal film provided on the array substrate.
Figure 21:
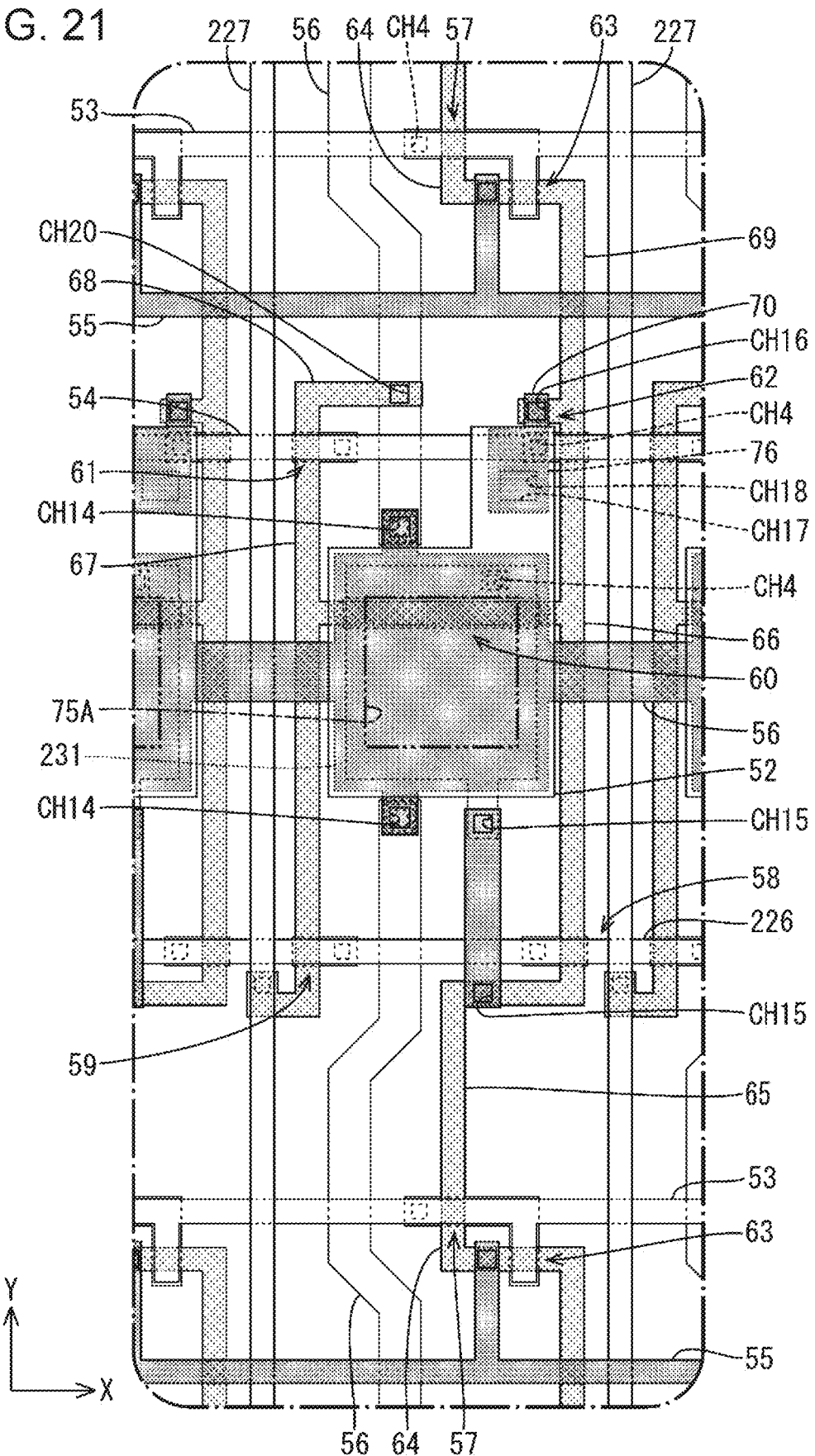
FIG. 21 is a plan view mainly illustrating patterns of a semiconductor film and a fourth metal film provided on the array substrate.

Subsequently, the structure of the array substrate 51 formed of each metal films 73, 74, 232, 236, and 238, and the semiconductor film 234 described above will be described with reference to FIGS. 20 and 21. FIG. 20 is a plane view illustrating the first metal film 232, the second metal film 236, and the third metal film 238 in a hatched shape, and the other metal films 73, 74 and the semiconductor film 234 in an outlined shape. FIG. 21 is a plan view illustrating the fourth metal film 73 and the semiconductor film 234 in a hatched shape, and each of the metal films 74, 232, 236, and 238 in an outlined shape. In the present embodiment, as illustrated in FIG. 20, the first metal film 232 forms a portion of the anode-side power supply wiring 56 (portion extending substantially along the Y axis direction) and the seventh coupling wiring 70, and forms a lower layer-side gate electrode of each of the TFTs 57 to 63. The second metal film 236 forms the gate wiring 226, the sub-gate wiring 53, and the EM wiring 54, and forms an upper layer-side gate electrode of each of the TFTs 57 to 63. The lower layer-side gate electrode and the upper layer-side gate electrode of each of the TFTs 57 to 63 are coupled to each other through a gate contact hole CH4 formed to open in the lower layer-side gate insulating film 233 and the upper layer-side gate insulating film 235. Although the upper layer-side gate electrode of the fourth TFT 60 formed of the second metal film 236 is smaller than the anode-side electrode 52, the upper layer-side gate electrode is disposed in a plane so as to overlap most of the anode-side electrode 52. A portion of the gate wiring 226 forms an upper layer-side gate electrode of each of the second TFT 58 and the third TFT 59, a portion of the sub-gate wiring 53 forms an upper layer-side gate electrode of each of the first TFT 57 and the seventh TFT 63, and a portion of the EM wiring 54 form an upper layer-side gate electrode each of the fifth TFT 61 and the sixth TFT 62, respectively. The third metal film 238 forms the source wiring 227. The fourth metal film 73 forms a portion of the anode-side power supply wiring 56 (portion extending substantially along the X axis direction) and the initialization power supply wiring 55, and forms an intermediate electrode 76 for coupling the seventh coupling wiring 70 to the anode-side electrode 52. As illustrated in FIGS. 19 and 21, in the anode-side power supply wiring 56, a portion formed of the first metal film 232 (portion extending substantially along the Y axis direction) and a portion formed of the fourth metal film 73 (portion extending substantially along the X axis direction) are coupled to each other through a lower layer-side intermediate electrode 77 formed of the second metal film 236 and an upper layer-side intermediate electrode 78 formed of the third metal film 238. Anode-side power supply wiring contact holes CH14 for are formed to open in the lower layer-side gate insulating film 233 and the upper layer-side gate insulating film 235 interposed between a portion formed of the first metal film 232 and the lower layer-side intermediate electrode 77 in the anode-side power supply wiring 56, the first interlayer insulating film 237 interposed between the lower layer-side intermediate electrode 77 and the upper layer-side intermediate electrode 78, and the third interlayer insulating film 72 interposed between the upper layer-side intermediate electrode 78 and a portion formed of the fourth metal film 73 in the anode-side power supply wiring 56, respectively. The fifth metal film 74 exclusively forms the anode-side electrode 52.

As illustrated in FIG. 21, the semiconductor film 234 forms the source region, the drain region, and the channel region of each of the TFTs 57 to 63, and also forms most of the coupling wiring 64 to 70. Specifically, the entire region of the first coupling wiring 64, the third coupling wiring 66, the fourth coupling wiring 67, the fifth coupling wiring 68, and the sixth coupling wiring 69 are not overlapped with the second metal film 236, and is formed of a low resistance region of the semiconductor film 234. The second coupling wiring 65 is formed of the low resistance region of the semiconductor film 234 except for a portion formed of the fourth metal film 73, which intersect the gate wiring 226, and is coupled to each other through a second coupling wiring contact hole CH15 formed to open in each of the insulating films 72 and 237 interposed therebetween a portion formed of the fourth metal film 73 and a portion formed of the low resistance region of the semiconductor film 234. In the seventh coupling wiring 70, a portion branched from the sixth coupling wiring 69 is formed of the low resistance region of the semiconductor film 234, and the seventh coupling wiring 70 is coupled to each other through a seventh coupling wiring contact hole CH16 formed to open in the lower layer-side gate insulating film 233 interposed between a portion formed of the low resistance region of the semiconductor film 234 and other portions formed of the first metal film 232. The portion formed of the low resistance region of the semiconductor film 234 in the seventh coupling wiring 70 is coupled to the intermediate electrode 76 formed of the fourth metal film 73 through an intermediate electrode contact hole CH17 formed to open in each of the insulating films 72 and 237 interposed therebetween. The intermediate electrode 76 is coupled to a portion of the anode-side electrode 52 formed of the fifth metal film 74 (portion protruding toward the sixth TFT 62 in the Y axis direction) through an anode-side electrode contact hole CH18 formed to open in each of the insulating films 239 and 240. The first coupling wiring 64 is coupled to a portion formed of the fourth metal film 73 in the initialization power supply wiring 55 through a first coupling wiring contact hole CH19 formed to open in each of the insulating films 72 and 237 interposed therebetween. In the third TFT 59, the source region formed of the low resistance region of the semiconductor film 234 is coupled to the source wiring 227 formed of the third metal film 238 through a source contact hole CH3 formed to open in the first interlayer insulating film 237 interposed therebetween.

As illustrated in FIG. 21, the anode-side power supply wiring 56 includes a substantially rectangular capacitance forming unit 231 overlapping with the anode-side electrode 52 and an upper layer-side gate electrode of the fourth TFT 60. The capacitance forming unit 231 is smaller than the anode-side electrode 52, and is larger than the upper layer-side gate electrode of the fourth TFT 60. As a result, an electrostatic capacitance (holding capacitance) 79 is formed between the capacitance forming unit 231 of the anode-side power supply wiring 56 and the upper layer-side gate electrode of the fourth TFT 60 (refer to FIG. 18). The portion formed of the first metal film 232 in the anode-side power supply wiring 56 is coupled to the fifth coupling wiring 68 through an anode-side power supply wiring contact hole CH20 formed to open in the lower layer-side gate insulating film 233.

Figure 22:
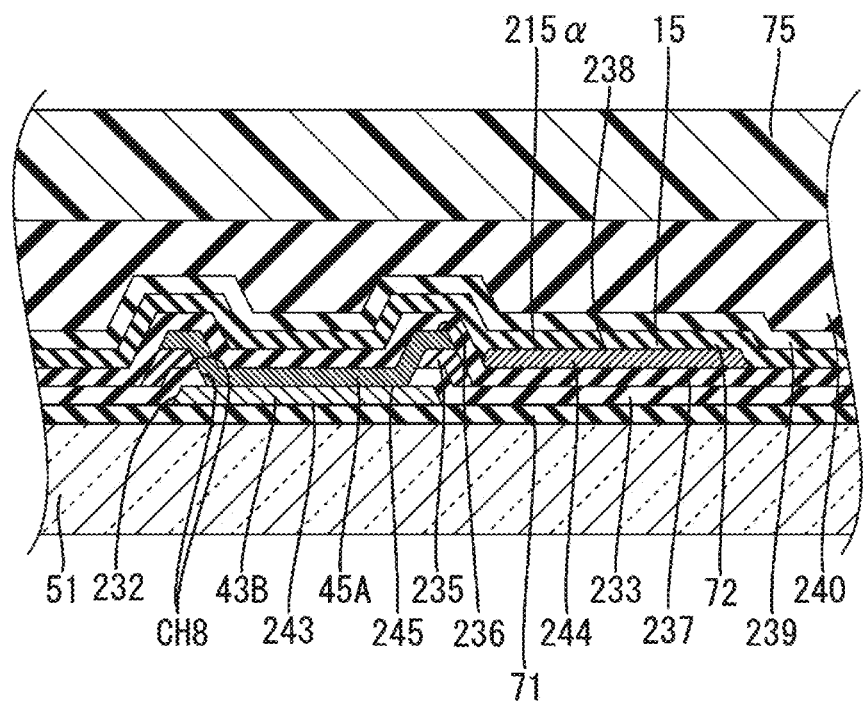
FIG. 22 is a cross-sectional view of a vicinity of a coupling portion between a terminal unit coupling portion and an intermediate portion of the first coupling wiring on the array substrate.

Here, a first coupling wiring 215α provided on the array substrate 51 will be described with reference to FIG. 22. FIG. 22 is a cross-sectional view of the vicinity of the coupling portion between the terminal unit coupling portion 243 and the intermediate portion 245 of the first coupling wiring 215α on the array substrate 51. The first coupling wiring 215α is configured to include a terminal unit coupling portion 243 formed of the first metal film 232, an intermediate portion 245 formed of the second metal film 236, and a source wiring coupling portion 244 formed of the third metal film 238. A third interlayer insulating film 72, a second interlayer insulating film 239, a flattening film 240, and a protection layer 75 are provided on the upper layer side of the source wiring coupling portion 244 which is the uppermost layer in the first coupling wiring 215α. Even in the case of the array substrate 51 provided in the organic EL display device 50 as in the present embodiment, similarly to Embodiment 1 described above, the adjustment range of the first coupling wiring 215α related to the wiring resistance is further broadened by the first coupling wiring 215α with rough end in a folded shape. As a result, a difference in wiring resistance that can occur between the first coupling wiring 215α and the second coupling wiring (refer to FIG. 7 of Embodiment 1) can be sufficiently reduced, and the signal transmission performance of the first coupling wiring 215α and the second coupling wiring can be made uniform.

The operation of the organic EL display device 50 having such a configuration will be described with reference to FIGS. 17 and 18. First, an off signal is input to the EM wiring 54 related to the n-th pixel unit PX. As a result, the fifth TFT 61 and the sixth TFT 62 related to the n-th pixel unit PX are turned off (non-driving state). Next, a scanning signal is supplied at the same timing to the gate wiring 226 related to the (n−1)-th pixel unit PX (preceding scanning order) and the sub-gate wiring 53 of the n-th pixel unit PX. At this time, since the first TFT 57 related to the n-th pixel unit PX is driven, the initialization power supply wiring 55 and the second coupling wiring 65 are conducted. As a result, the initialization signal transmitted by the initialization power supply wiring 55 passes through the source region, the channel region, and the drain region of the first TFT 57, and is further supplied to each gate electrode of the fourth TFT 60 through the second coupling wiring 65. Since the initialization signal has a potential exceeding the threshold voltage of the fourth TFT 60, the fourth TFT 60 is driven. At this time, the third coupling wiring 66 and the fourth coupling wiring 67 are conducted. Thereafter, since the off signal is input to the sub-gate wiring 53 related to the n-th pixel unit PX, the first TFT 57 related to the n-th pixel unit PX is turned off. Since the second TFT 58 is turned off, the initialization signal supplied to the second coupling wiring 65 is not supplied to the third coupling wiring 66. An image signal is supplied to the source wiring 227 related to the (n−1)-th pixel unit PX, and thereafter, a light emission control signal is supplied to the EM wiring 54 related to the (n−1)-th pixel unit PX.

Next, a scanning signal is supplied at the same timing to the gate wiring 226 related to the n-th pixel unit PX and the sub-gate wiring 53 related to the (n+1)-th pixel unit PX (subsequent scanning order). At this time, since the second TFT 58 and the third TFT 59 related to the n-th pixel unit PX are driven, the source wiring 227 and the fourth coupling wiring 67 are conducted, and the third coupling wiring 66 and the second coupling wiring 65 are conducted. When an image signal is supplied to the source wiring 227 at this timing, the image signal is transmitted from the source wiring 227 to the fourth coupling wiring 67. At this time, the fourth TFT 60 is driven based on the initialization signal supplied to each gate electrode, and the potential of each gate electrode is held by the electrostatic capacitance 79 formed between the fourth TFT 60 and the anode-side power supply wiring 56. Therefore, the image signal transmitted to the fourth coupling wiring 67 is supplied to the third coupling wiring 66 through the source region, the channel region, and the drain region of the fourth TFT 60. The image signal transmitted to the third coupling wiring 66 is supplied to the second coupling wiring 65 through the source region, the channel region, and the drain region of the second TFT 58. The image signal transmitted to the second coupling wiring 65 is supplied to each gate electrode of the fourth TFT 60. Each gate electrode of the fourth TFT 60 is held at a potential related to the image signal by the electrostatic capacitance 79 described above. Thereafter, an off signal is input to the gate wiring 226 related to the n-th pixel unit PX. Since the scanning signal is supplied to the sub-gate wiring 53 related to the (n+1)-th pixel unit PX, the seventh TFT 63 related to the n-th pixel unit PX is driven. Therefore, the sixth coupling wiring 69 and the seventh coupling wiring 70 are conducted to the initialization power supply wiring 55. As a result, the anode-side electrode 52 related to the n-th pixel unit PX has a potential related to the initialization signal.

Thereafter, a light emission control signal is supplied to the EM wiring 54 related to the n-th pixel unit PX. Since the light emission control signal has a potential exceeding the threshold voltage of the fifth TFT 61 and the sixth TFT 62, the fifth TFT 61 and the sixth TFT 62 are driven. At this time, the fourth coupling wiring 67 and the fifth coupling wiring 68 are conducted, and the third coupling wiring 66, the sixth coupling wiring 69, and the seventh coupling wiring 70 are conducted. Since the fifth coupling wiring 68 is coupled to the anode-side power supply wiring 56, a power supply signal transmitted to the anode-side power supply wiring 56 is supplied from the fifth coupling wiring 68 to the fourth coupling wiring 67 through the source region, the channel region, and the drain region of the fifth TFT 61. The power supply signal transmitted to the fourth coupling wiring 67 is supplied to the third coupling wiring 66 through the source region, the channel region, and the drain region of the fourth TFT 60. At this time, the power supply signal supplied to the third coupling wiring 66 is the potential of each gate electrode of the fourth TFT 60, that is, the potential based on the image signal supplied to the source wiring 227. The power supply signal adjusted to the potential based on the image signal supplied to the source wiring 227 in this manner is supplied from the third coupling wiring 66 to the sixth coupling wiring 69 and the seventh coupling wiring 70 through the source region, the channel region, and the drain region of the sixth TFT 62, and thereafter is supplied to the anode-side electrode 52. As a result, since the anode-side electrode 52 has a potential based on the image signal supplied to the source wiring 227, the light emitting layer of the organic EL device layer coupled to the anode-side electrode 52 emits an amount of light corresponding to the potential. Thereafter, when an off signal is input to the EM wiring 54 related to the n-th pixel unit PX, the fifth TFT 61 and the sixth TFT 62 are turned off, and light emission of the light emitting layer of the organic EL device layer is stopped. Therefore, the light emitting period of the light emitting layer is a period from when the light emission control signal is input to the EM wiring 54 related to the n-th pixel unit PX to when the off signal is input. That is, by adjusting the timing of inputting the light emission control signal and the off signal to the EM wiring 54, the light-emitting period and the non-light-emitting period of the light emitting layer can be controlled.

Other Embodiments

The present disclosure is not limited to the embodiments described with reference to the above description and drawings. For example, the following embodiments are also included in the technical scope of the present disclosure.

(1) In each of the embodiments described above, the configuration is described in which the first coupling wiring is routed so as to be folded once, and the first coupling wiring may be routed so as to be folded plural times.

(2) In Embodiments 1 and 3 described above, the configuration is described in which the first coupling wiring extends linearly along the Y axis direction, and the first coupling wiring may include a portion extending along an oblique direction to the X axis direction and the Y axis direction.

(3) In Embodiment 2 described above, the configuration is described in which the first coupling wiring extends along the Y axis direction while repeatedly meandering left and right in the X axis direction, and the first coupling wiring may include a portion extending along an oblique direction to the X axis direction and the Y axis direction while repeatedly meandering left and right in the X axis direction.

(4) In Embodiments 1 and 3 described above, the case is described where the terminal unit coupling portion and the source wiring coupling portion constituting the first coupling wiring are disposed so as not to overlap each other and are formed of the metal films different from each other. The terminal unit coupling portion and the source wiring coupling portion constituting the first coupling wiring may be disposed so as not to overlap each other, and may be formed of the same metal film (first metal film or third metal film).

(5) In Embodiments 1 and 3 described above, the case is described where the terminal unit coupling portion and the source wiring coupling portion constituting the first coupling wiring are disposed so as not to overlap each other. The terminal unit coupling portion and the source wiring coupling portion constituting the first coupling wiring may be disposed so as to overlap each other.

(6) In Embodiments 1 and 3 described above, the case is described where the intermediate portion constituting the first coupling wiring is disposed to overlap both the terminal unit coupling portion and the source wiring coupling portion. The intermediate portion may be disposed so as not to overlap one or both of the terminal unit coupling portion and the source wiring coupling portion. In that case, the intermediate portion and one or both of the terminal unit coupling portion and the source wiring coupling portion disposed so as not to overlap each other may be formed of the same metal film.

(7) In Embodiment 2 described above, the case is described where the terminal unit coupling portion, the source wiring coupling portion, and the intermediate portion constituting the first coupling wiring are disposed so as to overlap each other. Any two among the terminal unit coupling portion, the source wiring coupling portion, and the intermediate portion may overlap each other, and may be disposed so as not to overlap the remaining one. The terminal unit coupling portion, the source wiring coupling portion, and the intermediate portion may all be disposed not to be overlapped each other.

(8) In each of the embodiments described above, the case is described where the terminal unit coupling portion, the source wiring coupling portion, and the auxiliary coupling portion constituting the second coupling wiring are disposed so as to overlap each other. Any two among the terminal unit coupling portion, the source wiring coupling portion, and the auxiliary coupling portion may overlap each other, and may be disposed so as not to overlap the remaining one. The terminal unit coupling portion, the source wiring coupling portion, and the auxiliary coupling portion may all be disposed not to be overlapped each other.

(9) In addition to each of the embodiments described above, the overlapping width of the terminal unit coupling portion and the source wiring coupling portion with respect to the intermediate portion constituting the first coupling wiring can be appropriately changed. Similarly, the mutual overlapping width of the terminal unit coupling portion, the source wiring coupling portion, and the auxiliary coupling portion constituting the second coupling wiring can be appropriately changed.

(10) In each of the embodiments described above, the case is described where the first coupling wiring is configured to include three first coupling wiring constituting portions, and the first coupling wiring may be configured to include four or more first coupling wiring constituting portions. Similarly, the second coupling wiring may be configured to include four or more second coupling wiring constituting portions.

(11) In addition to each of the embodiments described above, the specific coupling positions of the first coupling wiring constituting portions constituting the first coupling wiring can be appropriately changed. Similarly, the specific coupling positions of the second coupling wiring constituting portions constituting the second coupling wiring can be appropriately changed.

(12) In each of the embodiments described above, the case is described where all three first coupling wiring constituting portions constituting the first coupling wiring are formed of the metal film is described, and the three first coupling wiring constituting portions constituting the first coupling wiring may include a portion formed of a low resistance region of a semiconductor film or a transparent electrode film. Similarly, the three second coupling wiring constituting portions constituting the second coupling wiring may include a portion formed of a low resistance region of a semiconductor film or a transparent electrode film.

(13) In each of the embodiments described above, the case is described where the gate wiring is formed of the second metal film, and the gate wiring may be formed of the first metal film. In that case, since a portion of the gate wiring forms the lower layer-side gate electrode, the island-shaped upper layer-side gate electrode formed of the second metal film may be coupled to the lower layer-side gate electrode.

(14) In each of the embodiments described above, the TFT having the double gate structure in which the lower layer-side gate electrode formed of the first metal film is coupled to the upper layer-side gate electrode formed of the second metal film is described. The TFT may have a single gate structure having a gate electrode formed of the second metal film. In this case, it is preferable that a light shielding unit formed of the first metal film and not coupled to the gate electrode is disposed to overlap the channel region on the lower layer side, and is not necessarily limited thereto.

(15) In each of the embodiments described above, the case is described where the coupling wiring is directly coupled to the source wiring, and a switch circuit unit (RGB switch circuit unit) or an ESD protection circuit unit may be interposed between the coupling wiring and the source wiring. The switch circuit unit has a function of distributing a signal supplied from the terminal unit side to a plurality of source wirings coupled to pixel units exhibiting different colors. Therefore, in the configuration in which the coupling wiring is coupled to the switch circuit unit, the number of terminal units and the coupling wiring can be smaller than the number of source wirings.

(16) In addition to each of the embodiments described above, the coupling position of the flexible substrate with respect to the array substrate in the X axis direction and the disposition of the terminal units on the array substrate in the X axis direction can be appropriately changed. In that case, the disposition of the first coupling wiring and the second coupling wiring on the array substrate in the X axis direction is changed according to the mounting position of the flexible substrate.

(17) In each of the embodiments described above, the case is described where only one flexible substrate is mounted on the array substrate, and a configuration in which a plurality of flexible substrates are mounted on the array substrate may be employed. In that case, the disposition of the first coupling wiring and the second coupling wiring on the array substrate in the X axis direction is changed according to the mounting position of each flexible substrate.

(18) In each of the embodiments described above, the case is described where the flexible substrate on which the driver is mounted by COF is mounted on the array substrate by COB, and the driver may be mounted on the array substrate by chip on glass (COG). In that case, the driver is mounted on the array substrate at a position on the display region side from the mounting region of the flexible substrate. The terminal unit coupled to the coupling wiring is disposed in the driver mounting region.

(19) In addition to each of the embodiments described above, the specific planar shape of the pixel electrode can be appropriately changed. For example, the pixel electrode may have a planar shape that is bent in the middle of running in the longitudinal direction, and in this case, the number of bending times may be one or more. The pixel electrode may have a planar shape (such as a square) other than a longitudinal shape.

(20) In each of the embodiments described above, the case is described where the ratio of the longitudinal dimension to the short dimension of the pixel electrode is set to three, and the ratio of the longitudinal dimension to the short dimension of the pixel electrode can be changed to other than three. For example, when the color filters disposed in the Y axis direction are four colors (for example, white in addition to R, G, and B), the ratio of the longitudinal dimension to the short dimension of the pixel electrode may be four.

(21) In addition to each of the embodiments described above, the specific routing path of the source wiring and the gate wiring can be appropriately changed. Similarly, the specific routing path of the capacitance wiring can be appropriately changed.

(22) In each of the embodiments described above, the case is described where the number of gate wirings is equal to the number of rows in the pixel electrodes in the Y axis direction and the number of source wirings is equal to the number of rows in the pixel electrodes in the X axis direction. In the liquid crystal panel, the number of gate wirings can be set to twice the number of pixel electrodes disposed in the Y axis direction, and the number of source wirings can be set to half the number of pixel electrodes disposed in the X axis direction.

(23) In addition to each of the embodiments described above, the specific screen size and resolution of the liquid crystal panel can be appropriately changed.

(24) In addition to each of the embodiments described above, the specific arrangement pitch of the pixel units in the liquid crystal panel can be appropriately changed.

(25) In each of the embodiments described above, the case is described where the gate circuit unit is provided on the array substrate, and the gate circuit unit may be omitted, and a gate driver having the same function as the gate circuit unit may be mounted on the array substrate. The gate circuit unit can be provided only on one side of the array substrate.

(26) In each of the embodiments described above, the case is described where the TFTs are disposed in a plane having a matrix shape on the array substrate, and the TFTs may be disposed in a plane having a zigzag shape.

(27) In Embodiments 1 and 2 described above, the configuration is described in which the pixel electrode is divided into four domains, and the number of divisions of the pixel electrode domain may be other than four. In that case, the planar shape of the boundary portion of the domain is changed, and accordingly, it is preferable to change the planar shape of the capacitance forming unit or the resistance reducing portion to a shape other than the cross shape.

(28) In addition to Embodiments 1 and 2 described above, the display mode of the liquid crystal panel may be a TN mode, an FFS mode, an IPS mode, or the like.

(29) In Embodiments 1 and 2 described above, the liquid crystal display device provided with the transmissive liquid crystal panel is described as an example, and the liquid crystal display device may include a reflective liquid crystal panel or a translucent liquid crystal panel.

(30) In Embodiment 3 described above, the top emission type organic EL display panel is described, and a bottom emission type organic EL display panel in which light emitted from the light emitting layer is emitted toward the array substrate side may be used.

(31) In addition to Embodiment 3 described above, the specific circuit configuration for supplying a signal to the anode-side electrode can be appropriately changed. For example, the number of TFTs can be changed to other than seven. The specific planar shape (routing shape) of the anode-side power supply wiring and the anode-side electrode, the specific planar shape of each coupling wiring, and the like can be appropriately changed. The specific arrangement order, planar shape, and the like of the gate wiring, the sub-gate wiring, the EM wiring, and the initialization power supply wiring can be appropriately changed. It is possible to appropriately change which metal film is used for the sub-gate wiring, the EM wiring, the initialization power supply wiring, and the anode-side power supply wiring. It is possible to appropriately change which metal film or low resistance region of the semiconductor film is used for each coupling wiring.

(32) In each of the embodiments described above, the case is described where the semiconductor film is formed of an oxide semiconductor, and the semiconductor film may be formed of amorphous silicon or polysilicon (LIPS).

(33) In each of the embodiments described above, the array substrate provided in the liquid crystal panel or the organic EL display panel is described as an example, and an array substrate provided in another type of display panel (such as microcapsule electrophoretic display panel (EPD)) may be used.

The invention claimed is:

1. A wiring substrate comprising:
  a signal supply unit;
  a plurality of wirings disposed in a wiring region in which an intermediate region is interposed between the wiring region and the signal supply unit, and having different distances from the signal supply unit; and
  a plurality of coupling wirings disposed in the intermediate region, and coupled to the signal supply unit and the plurality of wirings, wherein
  the plurality of coupling wirings includes a first coupling wiring coupled to a wiring having a short distance from the signal supply unit, and a second coupling wiring coupled to a wiring having a long distance from the signal supply unit among the plurality of wirings;

the first coupling wiring is folded back to the signal supply unit side in the middle of running from the signal supply unit to the wiring region; and the first coupling wiring includes a signal supply unit coupling portion coupled to the signal supply unit and extending toward the wiring region side, a wiring coupling portion coupled to the wiring and extending toward the signal supply unit side, and an intermediate portion coupled to each of an extension end-side portion of the signal supply unit coupling portion and an extension end-side portion of the wiring coupling portion.

2. The wiring substrate according to claim 1, wherein in the first coupling wiring, the signal supply unit coupling portion, the wiring coupling portion, and the intermediate portion are formed of a plurality of conductive films with an insulating film interposed therebetween, and the signal supply unit coupling portion, the wiring coupling portion, and the intermediate portion include portions that at least partially overlap each other through the insulating film.

3. The wiring substrate according to claim 2, wherein the signal supply unit coupling portion, the wiring coupling portion, and the intermediate portion are formed of the conductive films different from each other, and the signal supply unit coupling portion and the wiring coupling portion are disposed so as not to overlap each other, and the intermediate portion is disposed so as to partially overlap the signal supply unit coupling portion and the wiring coupling portion, respectively.

4. The wiring substrate according to claim 2, wherein the signal supply unit coupling portion, the wiring coupling portion, and the intermediate portion are formed of the conductive films different from each other, and the intermediate portion is formed of the conductive film located at an intermediate position between the conductive film constituting the signal supply unit coupling portion and the conductive film constituting the wiring coupling portion each through insulating film, respectively, and is coupled to the signal supply unit coupling portion and the wiring coupling portion through contact holes formed to open in each of the insulating films.

5. The wiring substrate according to claim 1, wherein the second coupling wiring has a plurality of second coupling wiring constituting portions formed of a plurality of conductive films having an insulating film interposed therebetween, and coupled to each other.

6. The wiring substrate according to claim 5, wherein the plurality of second coupling wiring constituting portions include portions that at least partially overlap each other through the insulating film.

7. The wiring substrate according to claim 6, wherein the second coupling wiring includes three or more second coupling wiring constituting portions, and the three or more second coupling wiring constituting portions are disposed in parallel with each other and to overlap each other through the insulating film.

8. The wiring substrate according to claim 1, further comprising:

a plurality of second wirings disposed in the wiring region and extending so as to intersect the wiring, wherein the plurality of wirings are disposed such that an arrangement interval thereof is larger than an arrangement interval of the plurality of second wirings.

9. The wiring substrate according to claim 1, wherein the first coupling wiring is folded back while meandering in a zigzag shape.

10. A display device, comprising:

the wiring substrate according to claim 1; and a plurality of pixel units disposed in the wiring region and coupled to the plurality of wirings.

11. The wiring substrate according to claim 1, wherein the first coupling wiring is configured such that the extension end-side portion of the signal supply unit coupling portion is disposed closer to the wiring region than the extension end-side portion of the wiring coupling portion.

12. The wiring substrate according to claim 11, wherein the first coupling wiring is configured such that the extension end-side portion of the signal supply unit coupling portion is disposed at a position adjacent to the wiring region, and the extension end-side portion of the wiring coupling portion is disposed at a position adjacent to the signal supply unit.

13. The wiring substrate according to claim 11, wherein in the first coupling wiring, the signal supply unit coupling portion, the wiring coupling portion, and the intermediate portion are formed of a plurality of conductive films with an insulating film interposed therebetween, and the signal supply unit coupling portion, the wiring coupling portion, and the intermediate portion each have parallel portions parallel to each other, and the parallel portions include portions that at least partially overlap each other through the insulating film.

14. A wiring substrate comprising:

a signal supply unit;

a plurality of wirings disposed in a wiring region in which an intermediate region is interposed between the wiring region and the signal supply unit, and having different distances from the signal supply unit; and a plurality of coupling wirings disposed in the intermediate region, and coupled to the signal supply unit and the plurality of wirings, wherein the plurality of coupling wirings includes a first coupling wiring coupled to a wiring having a short distance from the signal supply unit, and a second coupling wiring coupled to a wiring having a long distance from the signal supply unit among the plurality of wirings, the first coupling wiring is folded back to the signal supply unit side in the middle of running from the signal supply unit to the wiring region, and the second coupling wiring has a plurality of second coupling wiring constituting portions formed of a plurality of conductive films having an insulating film interposed therebetween, and coupled to each other.

15. The wiring substrate according to claim 14, wherein the plurality of second coupling wiring constituting portions include portions that at least partially overlap each other through the insulating film.

16. The wiring substrate according to claim 15, wherein the second coupling wiring includes three or more second coupling wiring constituting portions, and the three or more second coupling wiring constituting portions are disposed in parallel with each other and to overlap each other through the insulating film.

17. The wiring substrate according to claim 14, further comprising:

a plurality of second wirings disposed in the wiring region and extending so as to intersect the wiring, wherein the plurality of wirings are disposed such that an arrangement interval thereof is larger than an arrangement interval of the plurality of second wirings.

18. A display device, comprising:
the wiring substrate according to claim 14; and
a plurality of pixel units disposed in the wiring region and coupled to the plurality of wirings.

19. A wiring substrate comprising:
a signal supply unit;
a plurality of wirings disposed in a wiring region in which an intermediate region is interposed between the wiring region and the signal supply unit, and having different distances from the signal supply unit; and
a plurality of coupling wirings disposed in the intermediate region, and coupled to the signal supply unit and the plurality of wirings, wherein
the plurality of coupling wirings includes a first coupling wiring coupled to a wiring having a short distance from the signal supply unit, and a second coupling wiring coupled to a wiring having a long distance from the signal supply unit among the plurality of wirings,
the first coupling wiring is folded back to the signal supply unit side in the middle of running from the signal supply unit to the wiring region, and
a plurality of second wirings disposed in the wiring region and extending so as to intersect the wiring, wherein
the plurality of wirings are disposed such that an arrangement interval thereof is larger than an arrangement interval of the plurality of second wirings.

20. A display device, con rising:
the wiring substrate according to claim 19; and
a plurality of pixel units disposed in the wiring region and coupled to the plurality of wirings.

* * * * *